United States Patent
Davis et al.

(10) Patent No.: US 11,467,008 B1
(45) Date of Patent: Oct. 11, 2022

(54) VEHICLE ORIENTATION-DETERMINING PROCESS

(71) Applicant: Davis Intellectual Properties LLC, Asheville, NC (US)

(72) Inventors: Shannon R. Davis, Weaverville, NC (US); Charles Leo, Woodland Park, CO (US)

(73) Assignee: Davis Intellectual Properties LLC, Asheville, NC (US)

( * ) Notice: Subject to any disclaimer, the term of this patent is extended or adjusted under 35 U.S.C. 154(b) by 0 days.

(21) Appl. No.: 16/950,182

(22) Filed: Nov. 17, 2020

Related U.S. Application Data

(63) Continuation of application No. 15/833,703, filed on Dec. 6, 2017, now Pat. No. 10,852,165.
(Continued)

(51) Int. Cl.
    *G01D 11/10* (2006.01)
    *G01C 19/5783* (2012.01)
(Continued)

(52) U.S. Cl.
    CPC .............. *G01D 11/10* (2013.01); *B60R 16/02* (2013.01); *G01C 17/02* (2013.01);
(Continued)

(58) Field of Classification Search
    CPC ........ G05D 16/00; G05D 16/02; G05D 16/04; G05D 16/024; G05D 16/028; G05B 2219/00; G05B 2219/37134; G05B 2219/40597; G05B 2219/35214; G05B 2219/35422; G05B 2219/36492; G05B 2219/36503; G05B 2219/37069;
(Continued)

(56) References Cited

U.S. PATENT DOCUMENTS 5,825,287 A * 10/1998 Zarybnicky, Sr. .... F16D 66/028
    340/453
6,429,510 B1    8/2002 Moller
(Continued)

OTHER PUBLICATIONS

"FuelTech FT600. Extreme Performance ECU and Dashboard." by FuelTEch USA published Oct. 5, 2016, https://www.youtube.com/watch?v=FbSN9w05b30.

*Primary Examiner* — Anthony R Jimenez
(74) *Attorney, Agent, or Firm* — Fish & Richardson P.C.

(57) ABSTRACT

In general, the subject matter described in this disclosure can be embodied in methods, systems, and program products for receiving an indication that a vehicle has begun accelerating from a stationary state. A computing system sets, in response to having received the indication that the vehicle has begun accelerating from the stationary state, an orientation value generated using a gyroscope to a default orientation value. The computing system repeatedly updates the orientation value generated using the gyroscope, based on changes in gyroscope orientation that occurred after the computing system set the orientation value to the default orientation value. The computing system determines that the updated orientation value satisfies criteria that indicates that the vehicle is likely to encounter or has encountered a dangerous situation. The computing system outputs a signal to cause the vehicle to employ a safety measure.

16 Claims, 10 Drawing Sheets

Related U.S. Application Data

(60) Provisional application No. 62/430,450, filed on Dec. 6, 2016, provisional application No. 62/430,451, filed on Dec. 6, 2016.

(51) Int. Cl.
  *B60R 16/02* (2006.01)
  *H05K 1/18* (2006.01)
  *G01C 17/02* (2006.01)
  *H05K 7/14* (2006.01)

(52) U.S. Cl.
  CPC ........... *G01C 19/5783* (2013.01); *H05K 1/18* (2013.01); *H05K 7/1427* (2013.01); *H05K 2201/10151* (2013.01)

(58) Field of Classification Search
  CPC ........... G05B 2219/37194; G05B 2219/37197; G05B 2219/37404; G05B 2219/40564; G05B 2219/40566; G05B 2219/41111; G05B 2219/50353; G05B 2219/45048; G05B 2219/45018; G01S 19/00; G01S 19/01; G01S 19/03; G01S 19/26; G01S 19/31; G01S 19/33; G01S 19/38; G01S 19/393; G01P 1/00; G01P 9/00; G01P 15/00; G01P 15/001; G01P 15/02; G01P 15/0888; H05K 1/18; H05K 7/14; H05K 7/1427; H05K 2201/10151; G01C 17/00; G01C 17/02; G01C 19/00; G01C 19/025; G01C 19/04; G01C 19/08; G01C 19/34; G01C 19/36; G01C 19/38; G01C 19/40; G01C 19/44; G01C 19/5628; G01C 19/5783; G01C 19/58; G01C 19/60; G01C 21/00; G01C 21/10; G01C 21/12; G01C 21/14; G01C 21/16; G01C 21/165; G01C 21/18; G01C 21/20; G01C 21/24; G01C 21/28; G01C 25/00; G01C 25/005; G01C 15/00; G01C 9/00; B60R 16/02; G01D 11/10
  USPC ................................ 340/988, 545.5; 701/45
  See application file for complete search history.

(56) References Cited

U.S. PATENT DOCUMENTS

| | | | |
|---|---|---|---|
| 7,526,382 B2 * | 4/2009 | Gleacher | B60R 21/0132 701/45 |
| 7,606,660 B2 | 10/2009 | Diaz | |
| 8,207,693 B2 | 6/2012 | Hauser | |
| 8,554,440 B1 | 10/2013 | Davis | |
| 8,930,113 B1 | 1/2015 | Davis | |
| 9,539,900 B1 | 1/2017 | Davis | |
| 9,540,007 B1 | 1/2017 | Davis | |
| 10,132,829 B2 | 11/2018 | Zheng | |
| 2005/0051376 A1 * | 3/2005 | Cook | B60K 28/14 180/284 |
| 2007/0145193 A1 * | 6/2007 | Hakki | B64D 17/80 244/139 |
| 2008/0312829 A1 | 12/2008 | Allen | |
| 2013/0062866 A1 | 3/2013 | Breed | |
| 2014/0352400 A1 * | 12/2014 | Barrilado | G01C 25/005 73/1.38 |
| 2017/0314922 A1 | 11/2017 | Poulad | |

* cited by examiner

VEHICLE ORIENTATION-DETERMINING PROCESS

CLAIM OF PRIORITY

This application is a continuation of U.S. patent application Ser. No. 15/833,703 filed Dec. 6, 2017, which claims priority to U.S. Provisional Application Ser. No. 62/430,451, filed on Dec. 6, 2016 and U.S. Provisional Application Ser. No. 62/430,450, filed on Dec. 6, 2016, the entire contents of which are hereby incorporated by reference.

TECHNICAL FIELD

This document generally relates to devices and mechanisms to determine an orientation of a vehicle.

BACKGROUND

Automotive racing in various forms has become an increasingly popular and competitive sport. Teams of engineers and drivers are constantly working to improve vehicle performance to maintain a competitive advantage. In drag racing, for example, hundreds or thousandths of a second often separate the finishers of a drag race. Drag racers seek to generate a great amount of power with their vehicles, and to harness that power most effectively to propel the vehicle down a race track as quickly as possible. Unfortunately, the desire to generate as much power as possible can sometimes lead to catastrophic situations in which the driver loses control of the vehicle. Because the vehicle may be traveling at a significant speed, the driver may not have time to compensate for a loss of control, for example, by correcting the vehicle steering or by deploying a vehicle parachute.

SUMMARY

This document describes techniques, methods, systems, and other mechanisms for determining an orientation of a vehicle.

As additional description to the embodiments described below, the present disclosure describes the following embodiments.

Embodiment 1 is a computer-implemented method for outputting a signal to deploy a vehicle safety measure upon determining that criteria has been satisfied. The method comprises receiving, by a computing system, an indication that a vehicle has begun accelerating from a stationary state or is to begin accelerating from the stationary state. The method comprises setting, by the computing system and in response to having received the indication that the vehicle has begun accelerating from the stationary state or is to begin accelerating from the stationary state, an orientation value generated using a gyroscope to a default orientation value. The method comprises repeatedly updating, by the computing system and after the computing system received the indication that the vehicle has begun accelerating from the stationary state or is to begin accelerating from the stationary state, the orientation value generated using the gyroscope, based on changes in gyroscope orientation that occurred after the computing system set the orientation value to the default orientation value. The method comprises determining, by the computing system, that the updated orientation value satisfies criteria that indicates that the vehicle is likely to encounter or has encountered a dangerous situation. The method comprises outputting, by the computing system and in response to the computing system having determined that the updated orientation value satisfies the criteria that indicates that the vehicle is likely to encounter or has encountered the dangerous situation, a signal to cause the vehicle to employ a safety measure.

Embodiment 2 is the computer-implemented method of embodiment 1, wherein receiving the indication that the vehicle has begun accelerating from the stationary state or is to begin accelerating from the stationary state includes the computing system receiving a signal that indicates that a transmission brake of the vehicle has been released or is to be released.

Embodiment 3 is the computer-implemented method of embodiment 1. An orientation-determining device that is removably attachable to the vehicle includes the gyroscope. The orientation-determining device includes one or more processors. Execution by the one or more processors of computer-readable instructions causes performance of (i) the receiving of the indication that the vehicle has begun accelerating or is to begin accelerating, (ii) the setting of the orientation value generated using the gyroscope to the default orientation value, (iii) the repeatedly updating of the orientation value generated using the gyroscope, (iv) the determining that the updated orientation value satisfies the criteria, and (v) the outputting of the signal to cause the vehicle to employ the safety measure.

Embodiment 4 is the computer-implemented method of embodiment 3, wherein outputting the signal to cause the vehicle to employ the safety measure includes outputting a signal to cause the vehicle to deploy an aerodynamic device to slow the vehicle.

Embodiment 5 is the computer-implemented method of embodiment 1, wherein outputting the signal to cause the vehicle to employ the safety measure includes outputting a signal to cause a vehicle component to transition from an operational state to a non-operational state.

Embodiment 6 is the computer-implemented method of embodiment 1. The method further comprises determining, by the computing system, that the vehicle is not moving. The method further comprises determining, by the computing system, that an engine of the vehicle is operating. The method further comprises setting, by the computing system and in response to having determined that the vehicle is not moving and having determined that the engine of the vehicle is operating, the orientation value that was generated using the gyroscope to a different orientation value that was generated using an accelerometer.

Embodiment 7 is the computer-implemented method of embodiment 6. Determining that the vehicle is not moving includes determining that a force measurement generated using the accelerometer corresponds to gravity on Earth. Determining that the engine of the vehicle is operating includes determining that an orientation measurement obtained using the accelerometer does not correspond to an orientation measurement obtained using an orientation-identifying electronic device that includes an integrated accelerometer, an integrated gyroscope, and an integrated magnetometer.

Embodiment 8 is the computer-implemented method of embodiment 1. The method further comprises determining, by the computing system, that the vehicle is not moving. The method further comprises determining, by the computing system, that an engine of the vehicle is off. The method further comprises setting, by the computing system and in response to having determined that the vehicle is not moving and having determined that the engine of the vehicle is off, the orientation value that was generated using the gyroscope to a different orientation value that was generated using an orientation-identifying electronic device that includes an integrated accelerometer, an integrated gyroscope, and an integrated magnetometer.

Embodiment 9 is the computer-implemented method of embodiment 1. The method further comprises determining that a force measurement generated using the accelerometer corresponds to gravity on Earth. The method further comprises determining that an orientation measurement obtained using the accelerometer corresponds to an orientation measurement obtained using an orientation-identifying electronic device that includes an integrated accelerometer, an integrated gyroscope, and an integrated magnetometer. The method further comprises setting, by the computing system and in response to having determined that that the force measurement generated using the accelerometer corresponds to gravity on Earth and having determined that the orientation measurement obtained using the accelerometer corresponds to the orientation measurement obtained using the orientation-identifying electronic device, the orientation value that was generated using the gyroscope to the orientation value that was generated using the orientation-identifying electronic device.

Embodiment 10 is the computer-implemented method of embodiment 1. The method further comprises determining, by the computing system, that an actual vehicle offset from center position satisfies or exceeds a threshold vehicle offset from center position. The computing system is configured to cause the computing system to output the signal to cause the vehicle to employ the safety measure or another signal to cause the vehicle to employ another safety measure in response to the computing system having determined that the actual vehicle offset from center position satisfies or exceeds the threshold vehicle offset from center position.

Embodiment 11 is the computer-implemented method of claim 1. The method further comprises setting, by the computing system and in response to having received the indication that the vehicle has begun accelerating from the stationary state or is to begin accelerating from the stationary state, a lateral offset measurement of the vehicle to a default lateral offset value. The method further comprises repeatedly updating, by the computing system, a distance measurement generated using the accelerometer, the distance measurement indicating a distance travelled since the computing system received the indication that the vehicle has begun accelerating from the stationary state or is to begin accelerating from the stationary state. The method further comprises repeatedly updating, by the computing system, the lateral offset measurement based on the updated orientation value generated using the gyroscope and based on the updated distance measurement generated using the accelerometer.

Embodiment 12 is the computer-implemented method of embodiment 11, wherein the computing system is configured to output the signal to cause the vehicle to employ the safety measure in response to the computing system having determined that the lateral offset measurement satisfies a criterion that indicates that the vehicle has moved a lateral distance that is dangerous.

Embodiment 13 is a system. The system comprises a gyroscope; one or more processors; and one or more computer-readable devices including instructions that, when executed by the one or more processors, cause the one or more processors to perform the method of embodiments 1 through 12.

Embodiment 1 is an orientation-determining device to determine orientation of a vehicle. The device comprises a housing; a circuit board; an orientation-identifying electronic device that includes an integrated accelerometer, an integrated gyroscope, and an integrated magnetometer to determine and output an orientation measurement, the orientation-identifying electronic device being coupled to the circuit boards; a gyroscope that is coupled to the circuit board; an accelerometer that is coupled to the circuit board; and a dampening structure connected between the housing and the circuit board to isolate the circuit board, the orientation-identifying electronic device, the gyroscope, and the accelerometer from vibrations of the housing.

Embodiment 2 is the orientation-determining device of embodiment 1. The housing surrounds a first side of the circuit board to form a first cavity between the first side of the circuit board and the housing. The housing surrounds a second side of the circuit board to form a second cavity between the second side of the circuit board and the housing. The first side of the circuit board opposes the second side of the circuit board. The orientation-determining device further comprises a non-conductive fluid disposed in the first cavity and the second cavity.

Embodiment 3 is the orientation-determining device of embodiment 2, wherein the circuit board defines an opening through which the non-conductive fluid is able to flow between the first cavity and the second cavity.

Embodiment 4 is the orientation-determining device of embodiment 2, wherein the housing includes a port through that is adapted to permit introduction of the non-conductive fluid into the first cavity from an exterior of the housing.

Embodiment 5 is the orientation-determining device of embodiment 1, wherein the dampening structure includes (i) a first gasket connected between a first side of the circuit board and the housing, and (ii) a second gasket connected between a second side of the circuit board and the housing.

Embodiment 6 is the orientation-determining device of embodiment 5. The device further comprises a non-conductive fluid that is: (1) disposed in a first cavity that is formed between the first side of the circuit board and the housing; (2) contained within the first cavity by the first gasket; (3) disposed in a second cavity that is formed between the second side of the circuit board and the housing; and (4) contained within the second cavity by the second gasket.

Embodiment 7 is the orientation-determining device of embodiment 6, wherein the circuit board defines an opening that connects the first cavity to the second cavity and through which the non-conductive fluid is able to flow between the first cavity and the second cavity.

Embodiment 8 is the orientation-determining device of embodiment 1. The device further comprises a dampening foot that is (i) connected to the housing, (ii) located between a main body of the housing and a structure of the vehicle to which the orientation-determining device is configured to be attached.

Embodiment 9 is the orientation-determining device of embodiment 1, further comprising at least three dampening feet, each of the at least three dampening feet (i) being connected to the housing, (ii) defining an opening adapted to receive a fastening device to connect the orientation-determining device to a structure of the vehicle, and (iii) including a dampening material to limit vibrations in the structure of the vehicle from being transmitted to the housing of the orientation-determining device.

Embodiment 10 is the orientation-determining device of embodiment 9, wherein the at least three dampening feet are substantially equidistant from each other around a periphery of the housing.

Embodiment 11 is the orientation-determining device of claim 1. The device further comprises a power-connection terminal adapted to supply the orientation-identifying electronic device, the gyroscope, and the accelerometer with power when the power-connection terminal is connected to a power source. The device further comprises an electrical-energy-storage component adapted (i) to energize when the power-connection terminal is connected to the power source, and (ii) to store enough energy to enable the orientation-determining device to operate for at least twenty seconds independently of external power.

Embodiment 12 is the orientation-determining device of embodiment 11. The device further comprises one or more computer-readable memory devices adapted to store at least twenty seconds of orientation measurements generated using the gyroscope.

Embodiment 13 is the orientation-determining device of claim 1. The device further comprises a signal output terminal; and one or more processors configured through interaction with one or more computer-readable devices to analyze measurements generated by the orientation-identifying electronic device, the gyroscope, and the accelerometer to (i) determine whether an orientation of the device indicates that the vehicle is likely to encounter a dangerous situation, and (ii) provide an electrical signal to the signal output terminal as an indication to deploy an emergency safety measure. The signal output terminal is adapted to connect a conductor located externally to the device to the one or more computer processors, with the one or more computer processors being located internal to the housing of the orientation-determining device.

Embodiment 14 is the orientation-determining device of claim 1. The device further comprises an electrical input terminal; and electronics configured to set an orientation value generated by the gyroscope to a default orientation value upon receipt of an electrical signal received through the electrical input terminal. The electrical input terminal is adapted to connect a conductor located externally to the device to the electronics, the electronics being located internal to the housing of the orientation-determining device.

Particular implementations can, in certain instances, realize one or more of the following advantages. A vehicle orientation-determining device may be capable of determining its proper orientation, even when magnetic fields disturb some of its sensors. The sensor that may be used when magnetic fields disturb other sensors may be a gyroscope, and the orientation-determining device may compensate for drift inherent in the readings of the gyroscope. The orientation-determining device may determine that the vehicle position and/or orientation has reached dangerous, and may automatically deploy emergency measures faster than if the driver was solely responsible for deploying such emergency measures. Deploying emergency measures may limit vehicle damage and driver injuries that can occur in catastrophic situations.

Even in those situations in which safety measures are not deployed, the orientation-determining device may store force and position data from a race. Analyzing such data can enable vehicle teams to modify vehicle systems before the next race to fine-tune vehicle performance. Moreover, the force and position data can be used by the vehicle to adjust its performance in real time during the race (e.g., by slowing the engine down as the wheels are about to lose traction, or the nose of the vehicle is about to lift too high). The orientation-determining device may include an electrical storage unit (e.g., a battery) and internal memory, to ensure that vehicle data is captured and stored even in the event of a catastrophic event that may disrupt electrical connections between the orientation-determining device and an external source of power and an external memory storage unit, to help investigators determine what led to the catastrophic event.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
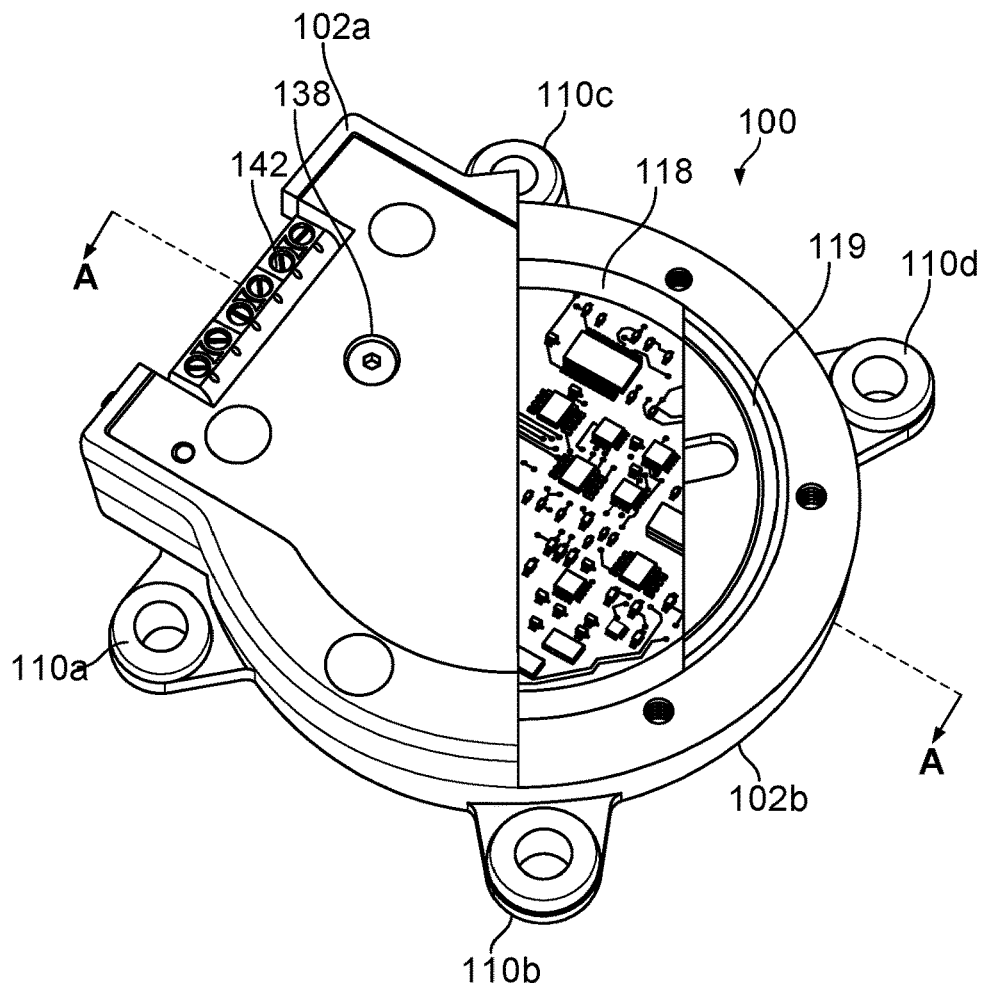
FIGS. 1A-B show views of an orientation-determining device.

This document generally describes devices and methods for determining an orientation of a vehicle.

Introduction

Vehicle racing is in need of an orientation-determining device that will reliably report the spatial orientation of a vehicle with respect to its starting orientation in a race, regardless of the measured forces of acceleration acting on the car. In some situations, the spatial orientation, described by the three Euler angle measurements of pitch, roll, and yaw, can be determined by measuring the direction in which a force attributed to gravity is directed. In racing, however, the forces of gravity can be largely indiscernible from other accelerative forces acting on the vehicle, such as the intentional acceleration of the vehicle and also the vibrations caused by the engine. Similarly, should the vehicle travel through air due to a catastrophic event such as a crash, the car becomes a free-falling object that is subject primarily to the deaccelerative forces that result from aerodynamic resistance. In such events, it is difficult to obtain the orientation of the vehicle from a gravity measurement.

The device described herein can determine the orientation of a vehicle even when the acceleration forces due to gravity are not detectable. Such an orientation-determining device can be used as a safety device in case a driver loses control of a vehicle. Upon the orientation-determining device determining that a predetermined condition indicates that a catastrophic situation has occurred or is likely to occur, the device can signal another system to take a safety measure, such as to deploy braking parachutes or to perform an emergency shut-down of the engine. The orientation-determining device can also be used as a performance-enhancing device. Orientation measurements transmitted by the device can be used by another device to determine whether to affect vehicle power levels or traction-control systems in order to limit conditions that degrade vehicle performance.

Devices known as Inertial Measurement Units (IMUs) use 3-axis measurements of linear acceleration, angular velocity, and ambient magnetic field to calculate absolute spatial orientation. IMUs may not always be able to determine the gravity vector by measuring acceleration forces, and in such circumstances the orientation of earth's magnetic field with respect to the IMU may be measured as a substitute for the gravity measurement. IMUs may be effective in laboratory conditions, but can be less effective in racing environments, for example, because starting a race car engine severely distorts the magnetic field around the engine and makes determining the orientation of the IMU with respect to the earth's magnetic field difficult. As such, in certain vehicles, once the engine of the vehicle has started, and particularly once that vehicle is moving down a racetrack, the IMU can lose the ability to monitor the gravity vector and the ambient magnetic field effectively and therefore may not be able to correctly identify the vehicle orientation.

A gyroscope may alternatively be used to determine the orientation of a vehicle because the gyroscope may not be affected as significantly by linear acceleration or magnetic fields. But while a gyroscopic sensor may function well in short-term tests, error can accumulate over time as an output of the gyroscope drifts, for example, in response to the temperature of the gyroscope increasing or decreasing.

A solution is to develop a device that uses an IMU under conditions where such a device is likely to function accurately, but a gyroscope when the IMU is unlikely to be accurate. When the IMU is likely to be function accurately, its measurements can be used to calibrate the gyroscope.

Safety

The orientation-determining device discussed herein is able to determine when a racing vehicle reaches a dangerous condition from which the driver has little or no chance of correcting. At this point, one or more signals from the orientation-determining device may trigger engine shut-down, deployment of a braking parachute, or another measure designed to slow the vehicle and lessen the chance of injury and damage.

The orientation-determining device can determine that a vehicle has reached a dangerous condition in various manners. One way that it can do so is by monitoring the spatial orientation of the device (and thus the vehicle). There are many incidents for which the safety of drivers, track officials, and spectators would have been enhanced with the early deployment of a braking parachute. Equipping a vehicle with a device that can monitor an orientation of the vehicle can allow the automatic deployment of safety measures when the orientation-determining device determines that the vehicle orientation reaches a point from which the driver is unlikely to recover.

Situations involving roll and yaw are typically undesirable, and automatically deploying safety measures when the roll or yaw is determined to be excessive would be helpful. Another commonly-dangerous experience is when the vehicle experiences excessive pitch, often known as "blowing over." The driver is tasked with controlling moderate pitch angle when the front of the car rises. This condition is normal in a drag race and, in many cases, desirable for a maximum performance. When the front rises, the driver must judge whether he or she can maintain control of the car, for example, by manipulating the throttle. The desire to win, the split-second nature of the decision, and the extreme circumstances of a competitive race make this judgement very difficult. If the driver reacts too slowly or misjudges his ability to maintain control, the pitch angle can very quickly increase.

Once the vehicle is out of control, the driver may manually deploy a braking parachute, but this rarely occurs at the precise moment when control is lost, and can often occur too late to have an effect. It is common for a vehicle to become airborne, becoming a danger to anyone and anything nearby. An automated parachute-deployment system that is triggered based on determinations made by the orientation-determining device described herein would improve safety.

The orientation-determining device can also monitor the car's velocity by integrating the acceleration determined by an accelerometer. This allows the orientation-determining device to determine when the car moves from the center of the track and approaches the wall or a boundary (e.g., either the left or right side of the track). Should the vehicle move too far from the center of the track, safety measures can be deployed to lessen any damage and the possibility of injury.

In the event that the car does contact the barrier wall, the orientation-determining device will measure the spike in G-forces that is caused by the impact using an internal accelerometer. Deploying a braking parachute at the instant of impact lessens the chance of the vehicle becoming airborne. If the vehicle does leave the ground, the braking parachute slows the car rapidly and lessens the possibility of damage and injury to structures, spectators, and race officials.

Performance and Tuning

The orientation-determining device may also be used to enhance performance. During a drag race, the pitch of the vehicle could be monitored and reacted upon to maintain a level of pitch that results in the best-possible coefficient of friction between the rear tires and the track. For example, should the pitch be determined to be excessive, a computing system on the vehicle could delay ignition timing, reduce fuel, or perform various other options for slowing the vehicle enough so that the vehicle reaches optimum pitch.

As a tool for tuning, acceleration and orientation data may be logged during a race or test session, and then used by team members to determine adjustments to the car chassis and timed changes in power application. Chassis adjustments could be indicated by the roll-angle of the car throughout the run. Power-related events, such as the injection of nitrous oxide, could be compared to small changes in acceleration in order to modify events for a smoother application of power.

Constant monitoring of acceleration during a drag race also allows a system to constantly adjust power to maintain a pre-programmed level of acceleration, resulting in a more efficient application of power for a shorter elapsed time. Systems perform this function based on engine or driveshaft RPM, but using the orientation-determining device may provide a more precise, fast-reacting measurement in order to enable dynamic adjustments based on acceleration.

As advanced automotive electronics become more capable, the need for precision in measurement and data-logging increases. An accurate measurement of orientation and acceleration will indicate inefficiencies in the application of power that can be improved with the application of precise programming changes. With currently-available over-filtered sensors, minor losses of acceleration are not reported and are therefore ignored in the tuning process.

Mechanical

A reason that current accelerometers are not accurate for measuring acceleration in a racing vehicle is that the vibration inherent in a race vehicle compromises the accuracy and reaction time of the measurement output. In order to overcome this, the vibration can be isolated and removed from the measurement. In current sensors, an accepted way to accomplish vibration removal is by applying a low-pass filter to the sensor output, either in the electronic circuitry or in software. A problem with this method is that the frequency of the vibration is not significantly higher than the desired frequency response of the acceleration measurement. This leads to a solution in which the cutoff frequency of the low-pass filter may be set lower than optimum (in terms of measurement response). This results in a measurement that is over-filtered. Small, fast acceleration changes would not be reflected in the measurement and all changes may be slightly delayed.

The orientation-determining device may be mounted to the vehicle using a vibration-dampening system in order to filter as much vibration as possible. The device includes at least three sensors: an IMU sensor with Euler-angle output (actually a collection of sensors monitored by its own processing unit, all within a single integrated circuit), a MEMS gyroscope within its own single integrated circuit, and a MEMS accelerometer within its own integrated circuit. When a processor in the orientation-determining device (separate from the processor in the IMU sensor) determines that the IMU is likely inaccurate due to environmental conditions (e.g., the presence of strong magnetic fields), and the accelerometer indicates that the orientation-determining device is moving, the gyroscope will be used to determine the current orientation. More specifically, the orientation-determining device will obtain orientation readings from an integrator circuit, which integrates the angular velocity output of the gyroscope. Due to accumulated error in the integration, the orientation output of the integrator circuit is only reliable for a short period of time. This is acceptable for drag racing, since the duration of each run is unlikely to exceed twenty seconds, but it is beneficial if the race begins with little error in the orientation measurement.

When the processor determines that the IMU is likely inaccurate and that the accelerometer indicates that the orientation-determining device is not moving (e.g., because the vehicle engine is running but the vehicle is not moving), the accelerometer output can be used to calibrate the gyroscope, and the orientation value of the accelerometer and gyroscope (now synced) will be used. When the processor determines that the IMU is likely accurate, the IMU will be used as the authoritative measurement of orientation (pitch, roll, and yaw), and these values can be used to calibrate the gyroscope and associated integrator circuitry.

The gyroscope circuitry needs to be calibrated because it's output value is vulnerable to drift based on temperature. In more detail, the gyroscope supplies analog voltages that represent the angular velocity of the measured axes. These voltages are then processed by an analog integrator circuit to produce an analog representation of the angular position. This system is vulnerable to drift in gyroscope output due to temperature-related deviation in output, because the gyroscope may be built from solid-state materials are sensitive to temperature changes. Because the output is accumulated, integration errors may accumulate over time. A level of an erroneous "drift" in the gyroscope output is measured by comparing the angular velocity output of the gyroscope to the same measurement from the accelerometer (when the engine is on but the vehicle is not moving) and/or the IMU (when the engine is on and the vehicle is not moving).

As previously mentioned, the integrator circuit receives at least two inputs: (1) the value from the gyroscope, and (2) a reference voltage that sets a baseline from which to determine the difference between the baseline and the gyroscope voltage for integration. The integrator circuit integrates the difference between these two inputs. The microcontroller, because it supplies the reference voltage, can adjust the reference voltage to calibrate to zero-drift (at least until the temperature changes again). By adding and subtracting precise amounts of position offset, the microcontroller can adjust the integral value to avoid the limits (voltage rails) of the integrator circuitry.

The following description of the figures provides additional detail regarding the construction and operation of the orientation-determining device that is described throughout this disclosure.

Figure 1B:
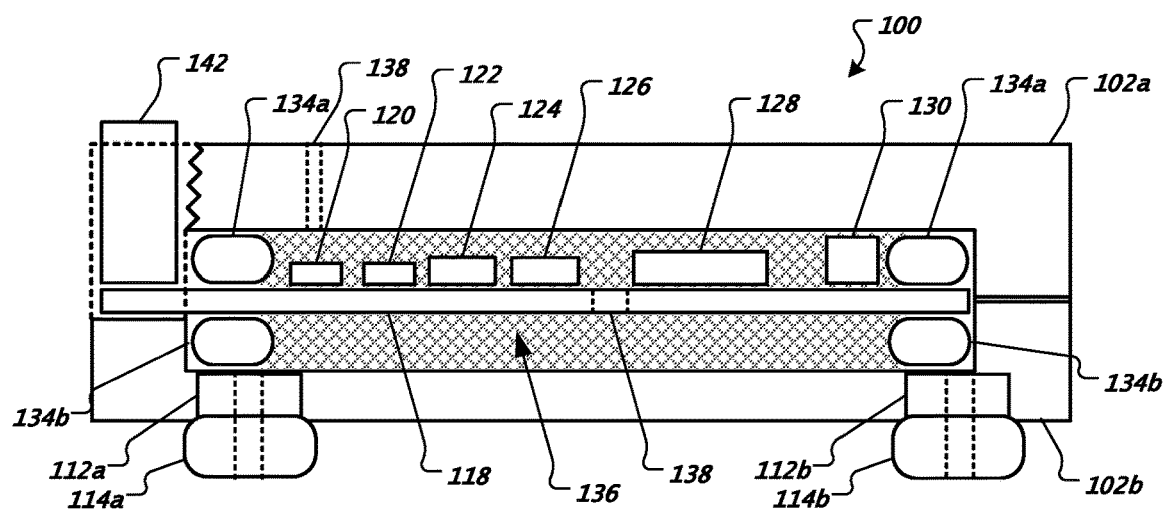

FIG. 1A shows a perspective cut-away view of an orientation-determining device 100, while FIG. 1B shows a side cut-away view of the same device 100, with the device in FIG. 1B being cut away along the "A" axis that is illustrated in FIG. 1A. Device 100 includes a top housing 102a and a bottom housing 102b, although the combination of the housings may be referred to as housing 102 herein because, when attached together (e.g., with fastening hardware), they form a single housing.

Device 100 is configured to be mounted to a vehicle at vibration mounts 110a-d. These mounts include a housing protrusion 112a,b that extends outwardly from the main body of the device housing. Each vibration mount includes a vibration dampening foot 114a,b underneath the housing protrusion. A fastening mechanism such as a bolt may extend through an aperture defined through the center of each of the vibration mounts 110a-d (and through each of its component pieces) to removably mount the orientation-determining device 100 to the vehicle. In some examples, the vibration mounts 110a-d each include a vibration-dampening grommet above each of the protrusions (e.g., as shown in FIG. 1A, but omitted from FIG. 1B for clarity). As such, a head to the bolt or other type of fastening mechanism may contact the vibration-dampening grommet, which contacts the housing protrusion, which contacts the dampening foot, which contacts the portion of the vehicle to which the device 100 is mounted. This stack of components may be sandwiched together by the fastening mechanism.

The housing 102 may surround a circuit board 118 on which various components are mounted, such as an IMU 120 (e.g., a specific type of orientation-identifying electronic device), a gyroscope 122, an accelerometer 124, a computer-readable memory device 126, a processor 128, and an energy-storage device 130. Each of these devices may be separately connected to the circuit board with separate conductors, such that these devices may be coupled to the circuit board (e.g., the device could be on a separate component or circuit board within the housing 102 but electrically coupled to the circuit board even though not physically affixed to the circuit board). To at least partially isolate the circuit board components from vehicle vibrations, the circuit board 118 may be suspended on at least one of its sides by a dampening structure. In the illustrated implementation, this dampening structure includes two rubber gaskets 134a,b (shown in FIG. 1B but not FIG. 1B) that sit between the circuit board and the housing, on opposite sides of the circuit board. In this way, the circuit board may not contact the housing, and its only connection to the housing (direct or through intervening structures) may be through a material that is compressible and absorbs vibrations (aside from fluid material, as discussed below). Each gasket 134a,b may contact a flat surface of the circuit board 118 and a flat surface 119 of the housing. Each gasket 134a,b may be flexible and have a torus shape, such that the gasket has a circular cross section and forms an O-ring (also called a toric joint). The gasket may be formed of an elastomer.

In some examples, the configuration of the circuit board 118 and the housing is such that a cavity is defined between the circuit board 118 and the housing. In some implementations, this cavity may be filled with a fluid 136. The fluid may be non-electrically conductive, such as mineral oil. The circuit board 118 may define an aperture 138 through the circuit board 118 that permits the fluid 136 to flow between a cavity on a top side of the circuit board 118 and a cavity on a bottom side of the circuit board 118. Fluid can be introduced into the cavities through a fill port 138 that can be closed to prevent fluid from leaking out of the device 100. The fluid can add mass to device 100 to dampen vibrations and can conduct and distribute heat away from electronics to dissipate heat away from temperature-sensitive components, such as the gyroscope 122.

The device also includes a terminal block 142 that includes multiple individual terminals for connecting conductors to the device 100, and specifically the circuit board 118. The various terminals may serve as inputs and outputs to the device 100, including power, ground, a transmission brake release input signal, and an employ safety device output signal. Some implementations of device 100 may include additional terminals to output additional signals, such as runtime orientation-identifying signals. The orientation-determining device 100 may include another communication port (e.g, USB) to enable the device 100 to be programed and to enable measurement data to be downloaded off of the device 100 after a race.

Figure 2:
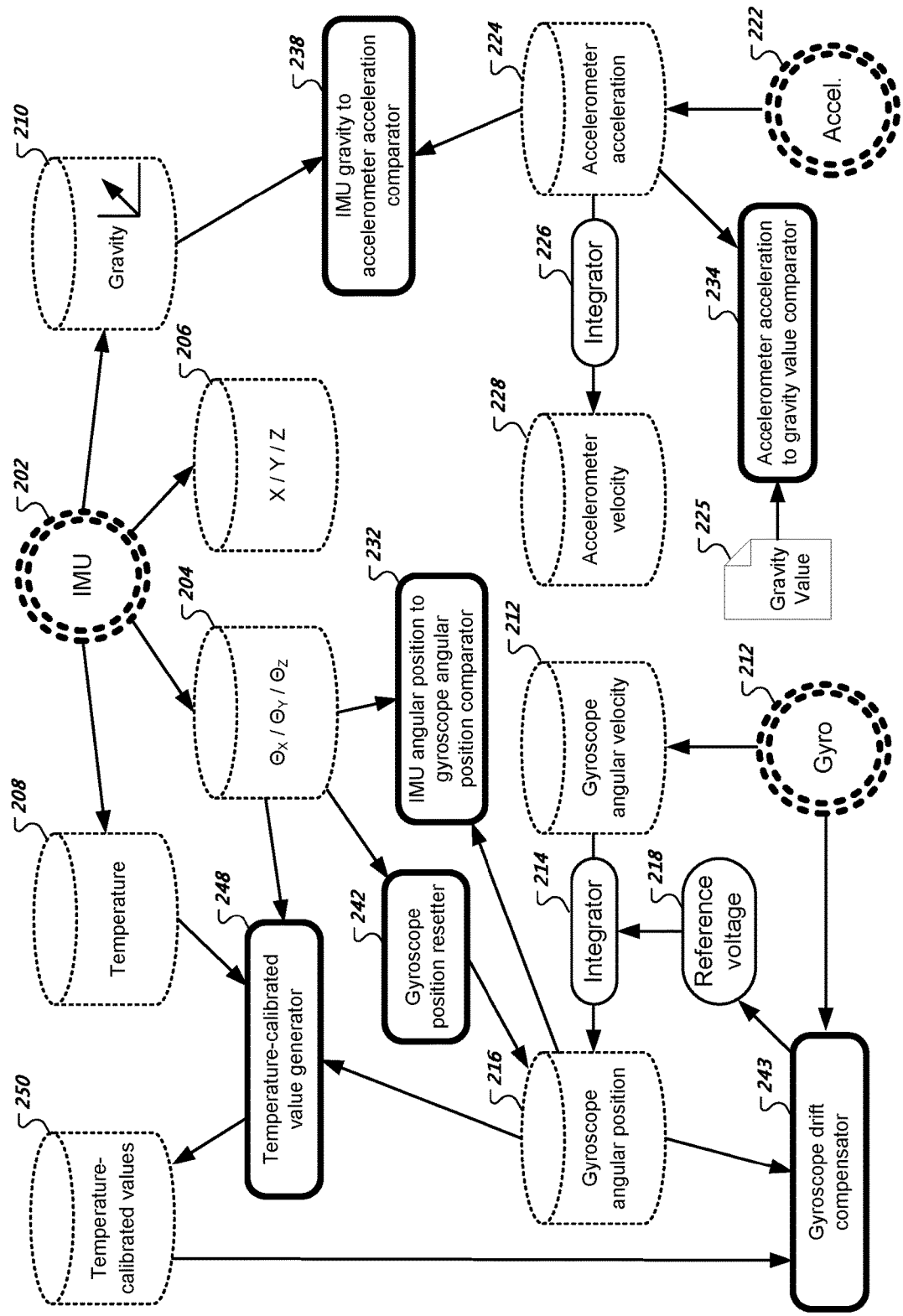
FIG. 2 shows an illustration of some of components of an orientation-determining device.

FIG. 2 shows an illustration of some components of the orientation-determining device 100 and the types of data that they generate. The following figures provide additional description regarding the operation of these components.

Orientation-determining device 100 includes an Inertial Measurement Unit (IMU) 202. IMU 202 may be a single electronic device that is contained within a single housing, and that includes integrated sensors, including a gyroscope, an accelerometer, and a magnetometer. Using the magnetometer and the other sensors, IMU 202 may be able to determine the orientation of device 100, and may output the determined orientation to an orientation datastore 204. The IMU may also output a determined position to a position datastore 206, a determined temperature to a temperature datastore 208, and a determined gravity vector to the gravity datastore 210. The IMU 202 may be particularly accurate when it is not exposed to magnetic fields. Any device that includes multiple different types of integrated sensors, including a magnetometer, and its own processor for determining angular orientation therefrom, can be used in place of a device that is specifically named an IMU. Such a device may also be able to output the velocity vector, the acceleration vector, the gravity vector, the angular velocity, and the angular acceleration.

A gyroscope 212 may output an angular velocity determined by the gyroscope 212 to the gyroscope angular velocity datastore 212. An integrator 214 can accumulate (e.g., integrate) angular velocities over a period of time to generate gyroscope angular positions for storage in gyroscope angular position datastore 216. Integrating the angular velocities can include integrating the difference between a gyroscope angular velocity and a reference voltage 218. Gyroscope 212 may comprise three orthogonally-oriented gyroscopes. As such, each gyroscope angular velocity reading in the gyroscope angular velocity datastore 212 may comprise three angular velocities that correspond to measurements generated by the three orthogonally-oriented gyroscopes. As such, the integrator may generate respective angular positions that represent pitch, roll, and yaw by integrating the three respective angular velocities over time.

Accelerometer 222 may generate the acceleration measurements that are stored in acceleration datastore 224. Accelerometer 222 may include three orthogonally-oriented component accelerometers, and therefore each acceleration measurement may comprise an acceleration measurement for each of its three component accelerometers. Integrator 226 can accumulate (e.g., integrate) the acceleration measurements for each component accelerometer over time to generate velocity measurements that are stored in accelerometer velocity datastore 228. Each velocity measurement comprises three component velocity measurements for the three-respective axes. Although not shown in FIG. 2, each velocity measurement can be accumulated (e.g., integrated) over time to obtain three-axes position measurements.

An IMU Angular Position to Gyroscope Angular Position Comparator can compare an angular position determined using the IMU 202 to an angular position determined using the gyroscope 212, and determine whether the two angular positions correspond to each other (e.g., are within a threshold value of each other). As discussed in additional detail elsewhere in this disclosure, should the orientations correspond to each other, the orientation-determining device may be configured to operate using measurements determined using the gyroscope, based on the assumption that the gyroscope is accurate because its measurements have been verified.

An Accelerometer Acceleration to Gravity Value Comparator 234 can compare an acceleration measurement of the accelerometer to a constant gravity value 225. The accelerometer may not be oriented with one of its three component accelerometers aligned exactly with the gravitational force, so the accelerometer or another component (such as comparator 234) may calculate the magnitude of the acceleration vector measured by accelerometer. Comparator 234 may then determine whether that magnitude corresponds to the magnitude of the constant gravity value 225 (e.g., by determining whether the magnitude of the acceleration vector falls within a threshold amount of 9.8 m/s2). Should the values correspond to each other, device 100 may designate the vehicle as resting, or perform operations that are associated with a vehicle being in a resting position, because the only acceleration forces acting on device 100 appear to be gravitational forces which would typically only be the case if the device was resting.

An IMU Gravity to Accelerometer Acceleration Comparator 238 can compare an acceleration measurement of the accelerometer to a gravity measurement generated by the IMU 202, for example, by determining whether the measurements are within a threshold amount of each other (e.g., in total magnitude or for each axis). Because the IMU 202 may generate erroneous gravity measurements in the presence of significant magnetic fields, a determination that the accelerometer acceleration measurement corresponds to the IMU gravity measurement may indicate that there are not significant magnetic fields present, for example, because the vehicle engine is off.

A Gyroscope Position Resetter 242 can reset the angular position of the gyroscope 212 to a default value (e.g., 0, 0, 0). The angular position may be stored digitally or may be represented as analog values output by an electronic component. The reset may occur at the start of a race, for example, in response to the vehicle transmission brake being released. The gyroscope position resetter 242 can also set the gyroscope angular position to that of the IMU angular position 204, in those instances in which the gyroscope angular position measurement 216 is calibrated to be that of the IMU 202.

A Gyroscope Drift Compensator 243 can change the reference value 218 that is input to the integrator in order to compensate for gyroscopic drift that can be caused, for example, by temperature variation. For example, when the vehicle is determined to not be moving by the IMU 202, the angular velocity values output by the gyroscope 212 should read a default value (e.g., 0, 0, 0). To the extent that those values are not zero, the gyroscope can be configured to change its output to the default value, or the reference voltage 218 provided to the integrator 214 can be changed to correspond to the output value of the gyroscope 212. Because the integrator 214 accumulates differences between the output of the gyroscope 212 and the reference voltage 218, setting the reference voltage 218 to correspond to the output of the gyroscope means that there will not be any accumulated values and change in angular position (at least until device 100 is moved or the gyroscope 212 output begins to drift due to temperature variation).

A Temperature-Calibrated Value Generator 248 can, when the vehicle is determined to be not moving and not have its engine on, record the temperature 208 of the IMU 202 (or another component of device 100, such as the gyroscope 212), and the difference between angular velocity or orientation measurements of the IMU 202 and the gyroscope 212 (or the values of each to enable difference values to be calculated). Doing so enables the gyroscope drift compensator 243 to compensate for gyroscopic drift even when the vehicle is determined to be moving. For example, should the vehicle have been determined to be moving for a certain period of time without stopping (such that it has been awhile since drift was compensated), the gyroscope drift compensator 243 may determine the current temperature, identify the previous difference between gyroscope output and IMU output when that temperature was previously encountered (by accessing the temperature-calibrated values datastore 250), and then compensate for drift by the previous difference (e.g., by adjusting the reference voltage 218 by the same amount).

Figure 3:
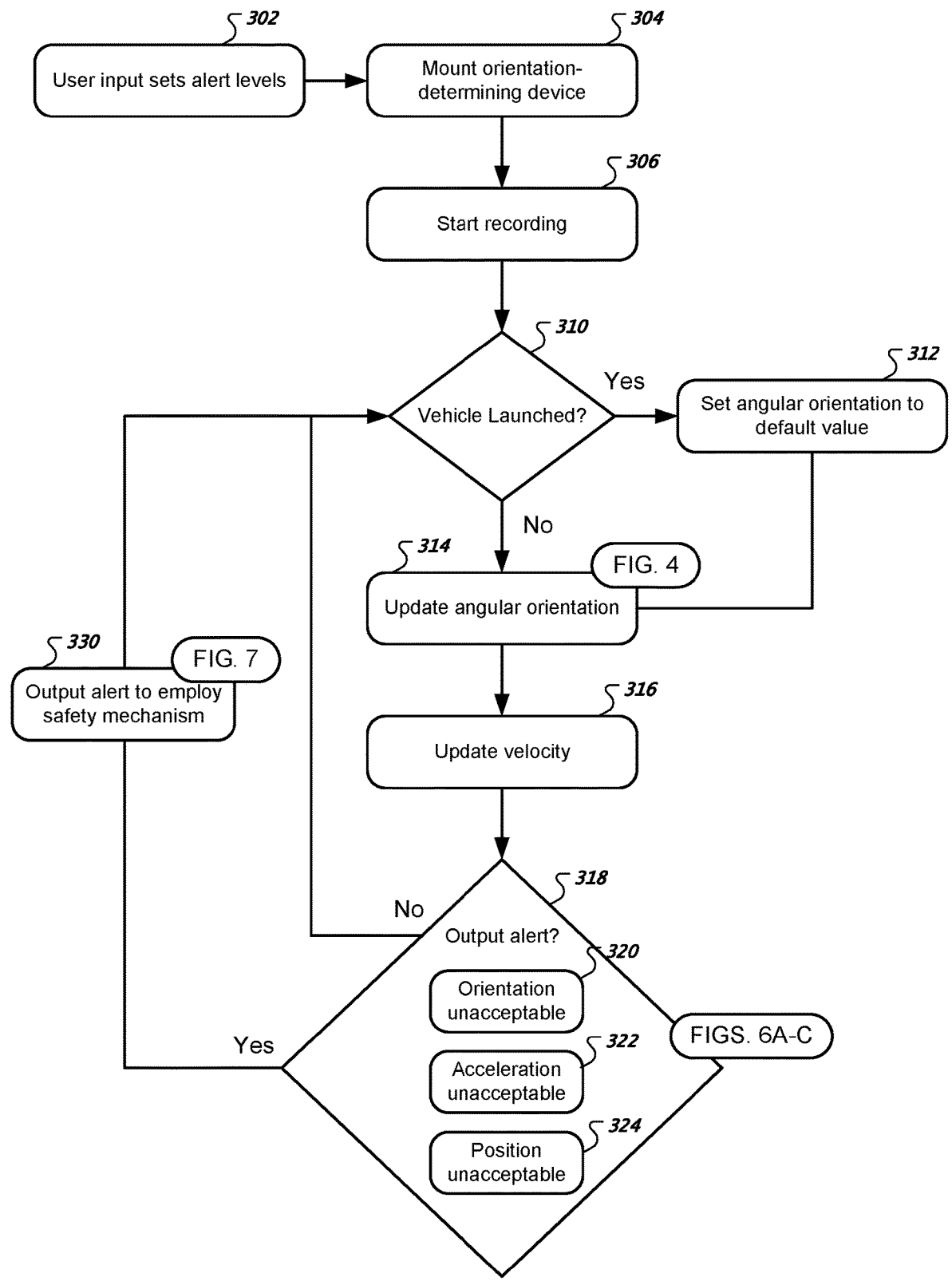
FIG. 3 shows a flowchart of operations performed by an orientation-determining device.

FIGS. 3-7 show flowcharts that describe the operation of the orientation-determining device 100. FIG. 3, in particular, shows a set of operations performed by device 100, while other flowcharts show additional details on some of those operations.

At box 302, the orientation-determining device 100 receives user input to set alert levels. For example, a user may connect device 100 to a separate computer (e.g., using a USB or wireless connection). Connecting device 100 to the separate computer enables a user to interact with the computer to specify various alert levels. These alert levels may specify thresholds at which the device 100 should output a signal indicating that a safety device is to be employed. These thresholds can include the orientation level at which an alert should be triggered, a distance from center of track at which an alert should be triggered, and an acceleration level at which an alert should be triggered.

At box 304, a user of the orientation-determining device 100 mounts the device 100. For example, the user may drill four holes in a frame or another component of a vehicle and may mount the device 100 to the frame using four bolts placed through the apertures in mounts 110a-d. The dampening material in the mounts, along with gaskets 134a-b, at least partially isolates components on circuit board 118 from vehicle vibrations, especially higher-frequency vibrations.

At box 306, the orientation-determining device 100 starts recording. The device 100 may do so in response to a user input that pressed an input mechanism on device 100, or in response to device 100 receiving an electrical signal of a particular characteristic or at a particular terminal. The electrical signal may be provided by a switch that is user activated.

At box 310, device 100 determines whether the vehicle has launched or is about to launch. Determining whether the vehicle has launched or is about to launch includes receiving an electric or wireless signal that indicates that the vehicle has launched or is about to launch. The signal may have been generated in response to the transmission brake being released. The signal may have been generated in response to activation of another component of the vehicle that occurs when the vehicle launches or is about to launch in a drag race.

At box 312, in response to device 100 having determined that the vehicle has launched or is about to launch (e.g., in response to having received a signal at a particular terminal of the device 100), device 100 sets its angular orientation to a default value. The angular orientation may comprise a collection of three angular orientations that represent pitch, roll, and yaw. Resetting the angular orientation can include setting these three angular orientations to 0, 0, 0 or some other orientation that is specified as a default value.

These values may change as the orientation of the vehicle changes. The orientation of the vehicle may be reset in response to receiving the launch signal because the orientation of the vehicle may be measured with respect to the orientation when the vehicle was at the starting line and presumably facing down the racetrack. In some examples, the orientation of the vehicle can be reset in response to device 100 receiving a signal that resulted from user input specifying that the angular position should be set to a default value.

In some examples, the vehicle position (e.g., the integration of the linear velocity) is also set to a default value in response to device 100 having determined that the vehicle has launched or is about to launch (or having received user input that the vehicle position/orientation should be reset).

At box 314, in response to determining that the vehicle has not launched or is about to launch (and thus that the vehicle is pre-launch or post-launch), one or more computer processors of device 100 update the angular orientation of the device. For example, device 100 (and thus the race vehicle) may be moving down the race track, and while doing so the front of the vehicle may rise, the frame may roll, and the vehicle may turn to the side. Device 100 may determine at box 314 that the angular orientation of the vehicle had changed. Additional detail regarding the updating of the angular orientation is described with respect to FIG. 4.

At box 316, device 100 updates its velocity. For example, device 100 (and thus the race vehicle) may move down the track, and as it does so the velocity of device 100 may be measured. Device 100 may do so by receiving acceleration measurements from an accelerometer of the device and integrating those measurements to obtain the vehicle velocity. The integration may be done by one or more dedicated integrator circuits or by one or more computer processors.

At box 318, device 100 determines whether to output an alert to employ a safety measure. Determining whether to output the alert can include determining whether the vehicle orientation is currently unacceptable (box 320, see FIG. 6A), determining whether the vehicle acceleration is currently unacceptable (box 322, see FIG. 6B), and/or determining whether the vehicle position is currently unacceptable (box 324, see FIG. 6C). Any one or more of these determinations can be considered in determining whether to output an alert signal to cause another vehicle component to employ a safety measure. These determinations are discussed in additional detail with respect to FIGS. 6A-C.

Should device 100 determine that criteria is not satisfied for outputting an alert, device 100 again performs the operations of box 310 (or possibly returns to box 314 if the vehicle is determined to have already launched). In some examples, the operations of box 310 can include determining that the transmission brake has been released, which would unlikely occur again during a race after a vehicle has already launched. Put simply, every time the transmission brake releases, the angular orientation of the vehicle can be reset in any combination of measurement units for the IMU, the gyroscope, and the accelerometer.

Should device 100 determine that criteria has been satisfied for outputting an alert, device 100 may output an alert (box 330), for example, by sending a signal to cause one or more other vehicle component employ one or more safety devices. Deploying a parachute is an example of employing a safety device. The operation of box 330 is discussed in additional detail with respect to FIG. 7.

Figure 4:
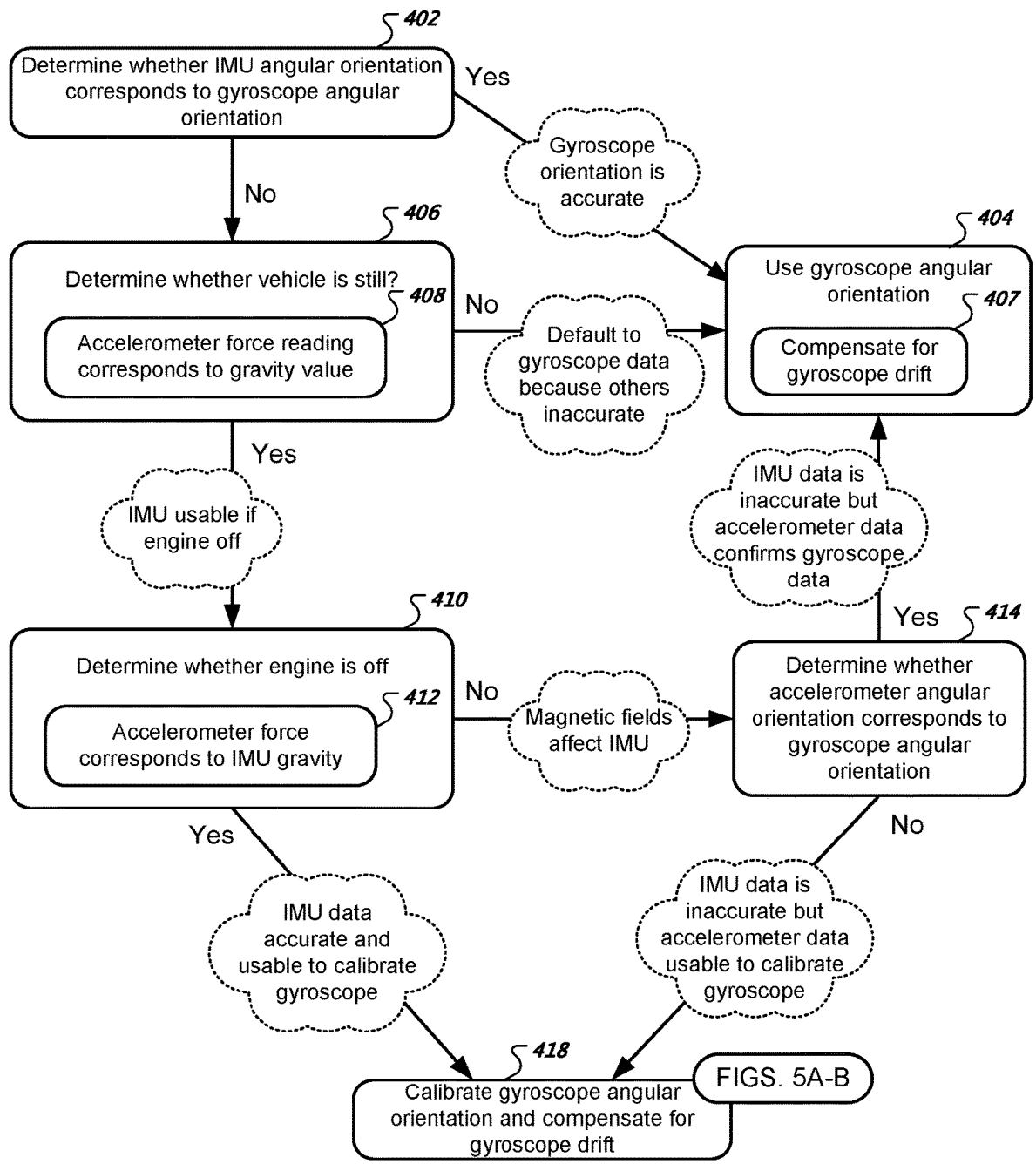
FIG. 4 shows a flowchart of operations for updating an angular position of the orientation-determining device.

FIG. 4 shows a flowchart of operations for updating an angular orientation of device 100, which may be performed as part of the execution of box 314 in FIG. 3.

At box 402, device 100 (e.g., one or more processors of device 100) determines whether the angular orientation of the IMU (or a similar device that includes multiple component sensors, such as a magnetometer, as discussed previously) corresponds to the angular orientation of the gyroscope. Device 100 may be configured to perform this determination because the IMU may have great accuracy in determining angular orientation, but that accuracy may not be present under some circumstances, such as when a drag racing vehicle is racing down a track. If the two angular orientations correspond to each other (e.g., because they are within a threshold amount of each other for pitch, roll, and yaw), then device 100 may operate under the assumption that the gyroscope is accurate and therefore may use the angular orientation of the gyroscope (box 404). Since the angular orientation of the gyroscope corresponds to the angular orientation of the IMU in this situation, using the angular orientation of the IMU is an acceptable alternative and should be considered the same as using the angular orientation of the gyroscope.

At box 406, device 100 determines whether the vehicle is sitting still. Device 100 may be configured to perform this determination because, if the vehicle is not sitting still (i.e., because it is moving), then device 100 may use the angular orientation of the gyroscope without going through other operations to determine whether the gyroscope should be calibrated, because the movement of the vehicle and the magnetic fields generated by the engine under such conditions may render IMU and accelerometer measurements unreliable. Determining whether the vehicle is sitting still can include determining whether the accelerometer force reading corresponds to the constant of gravity (box 408). For example, a magnitude of the accelerometer force reading as measured by the three component accelerometers may be determined, and device 100 may determine whether the magnitude of this force corresponds to 9.8 m/s2.

Should the vehicle be determined to not be standing still (and thus is determined to be moving), device 100 may perform the operations of box 404 and use the angular orientation of the gyroscope in its angular orientation calculations. At box 407, before or after using the angular orientation of the gyroscope, device 100 may compensate for gyroscope drift. As described in additional detail elsewhere in this disclosure, as the temperature of the gyroscope changes, its output value can drift from a "true" value. The amount of this drift for a particular temperature can be measured when the vehicle is determined to be sitting still (as measured by comparing the IMU or accelerometer angular orientation to the gyroscope angular orientation). As such, at box 404, device 100 can compensate for the gyroscopic drift, for example, by modifying the reference voltage that is supplied to an integrator.

At box 410, device 100 determines whether the vehicle engine is off. Device 100 may be configured to perform this determination, because if the vehicle engine is off (or is otherwise not disrupting operation of the IMU), then the angular orientation of the IMU may be considered accurate and the gyroscope can be calibrated based on measurements generated by the IMU.

Device 100 may determine whether the IMU is operating accurately by determining whether the accelerometer force measurements correspond to the gravity measurement that is generated by the IMU (box 412). The two readings may correspond if the magnitude of the force vectors are within a threshold difference of each other. The two readings may also or alternatively correspond if the direction of the force vectors are within a threshold difference of each other. In some examples, the IMU gravity measurement may be determined at least partially using its internal magnetometer. In some examples, the IMU measurement discussed herein is the force measurement determined by the IMU, and that force measurement is compared to the force measurement obtained from the accelerometer that is not integrated into the IMU (which can also be referred to more broadly as a multi-sensor circuit). If the vehicle engine is not determined to be off (e.g., because the vehicle engine is on or the IMU sensor is otherwise disrupted), then device 100 may perform the operations of box 414.

At box 414, device 100 determines whether the angular orientation of the accelerometer corresponds to the angular orientation of the gyroscope. Device 100 may be configured to perform this determination when the IMU is not determined to be accurate, to determine whether the accelerometer is providing accurate force readings. If so, the gyroscope can be calibrated based on measurements from the accelerometer.

The angular orientation of the accelerometer can be determined from the direction of the force vector measured by the accelerometer, which should correspond to the direction of gravitational pull since the vehicle has been determined to be sitting still. This direction of the gravitational pull can be used to identify the angular orientation of the vehicle, and that accelerometer-determined angular orientation can be compared to the gyroscope-determined angular orientation to determine whether those two measurements correspond.

If the angular orientations determined from the accelerometer and the gyroscope correspond to each other, then device 100 may simply use the angular position of the gyroscope (which should be considered the same as using the angular position of the accelerometer, because they have been determined to correspond to each other) (see box 404). The gyroscope measurements, however, can drift. As such, should the angular orientations not correspond to each other (likely due to this drift), device 100 may calibrate the gyroscope using the accelerometer data (see box 418).

At box 418, device 100 calibrates the angular orientation of the gyroscope to correspond to that of the IMU (when immediately preceded by box 410) or that of the accelerometer (when immediately preceded by box 414), and compensates for gyroscope drift. This sets the gyroscope to the angular orientation specified by either the IMU or the accelerometer, as described in further detail with regard to FIGS. 5A-B.

Figure 5A:
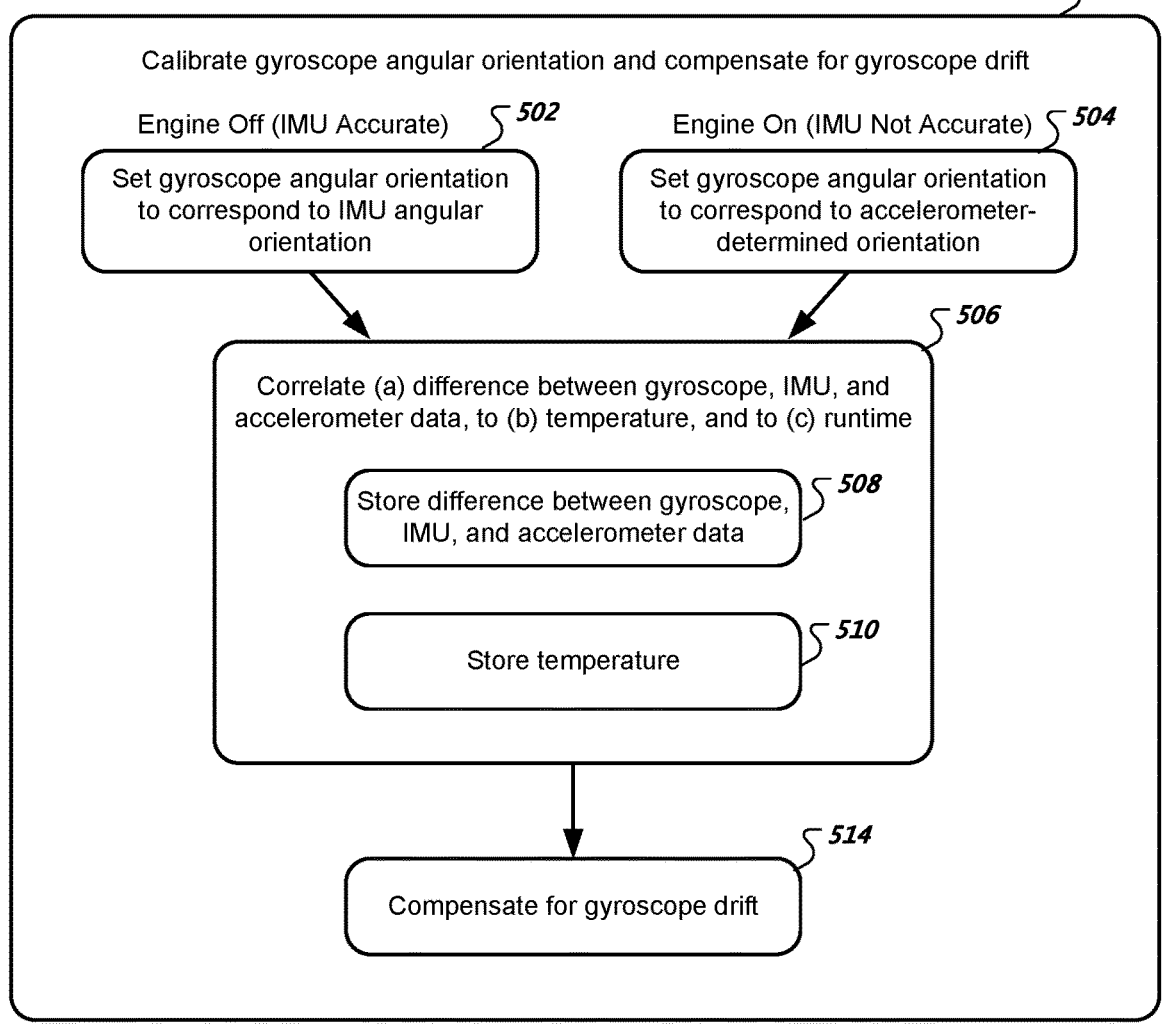
FIG. 5A shows a flowchart for calibrating a gyroscope.

FIG. 5A shows a flowchart for calibrating the gyroscope angular orientation and compensating for gyroscope drift. This process is described with reference to FIG. 5B, which shows a graph that illustrates gyroscope drift and compensating for that drift when the vehicle has been determined to not be moving.

At box 502, in response to the engine being determined to be off, device 100 sets the gyroscope angular orientation to correspond to the IMU angular orientation (the IMU angular orientation may be determined without using measurements generated using the gyroscope). This occurs because the state of device 100 has been identified as one in which the IMU is producing accurate angular orientation measurements and there happens to be a difference between the IMU angular orientation measurement and the gyroscope angular orientation measurement (presumably because of error due to drift by the gyroscope output). As such, the angular orientation measurement values for the IMU may replace the angular orientation measurement values for the gyroscope. In examples in which the angular orientation is represented by an analog voltage, that analog voltage may be modified in various manners to achieve a value that represent the same angular orientation as the IMU.

At box 504, in response to the engine being determined to be on and the gyroscope orientation not corresponding to the accelerometer orientation, device 100 sets the angular orientation of the gyroscope to correspond to that of the accelerometer (the accelerometer orientation may be determined without using data generated using the gyroscope). This occurs because the state of device 100 has been identified as one in which the IMU may not provide accurate angular orientation measurements, and with the gyroscope and accelerometer orientation readings not corresponding to each other, the accelerometer values are considered trustworthy because its readings corresponded to gravity. The gyroscope angular orientation may differ from the accelerometer reading due to error caused by drift.

At box 506, device 100 correlates the difference between the angular orientation of the gyroscope and that of either the IMU or the accelerometer to the temperature. For example, device 100 may store the difference between the gyroscope angular orientation and either the IMU angular orientation or the accelerometer angular orientation (all of these defined as an orientation determined using the respective sensors, even though intervening processing may be required) (box 508). At a corresponding time, the current temperature inside device 100 may be stored (box 510). Device 100 may store this difference before the gyroscope orientation is changed to correspond to either the IMU or accelerometer data. In some examples, storing the difference includes device 100 storing the different angular orientation values and the actual difference is calculated at a later time.

At box 514, device 100 may compensate for gyroscope drift. Doing so may include, when the vehicle is determined to not be rotating, setting the reference voltage that is input to the integrator to the same value as the output of the gyroscope. Doing so may compensate for drift in the gyroscope output value. The drift may be caused by a temperature change in the electronics that form the gyroscope. This drift, the resulting error, and the compensation of the gyroscope drift are discussed in additional detail with respect to FIG. 5B.

Figure 5B:
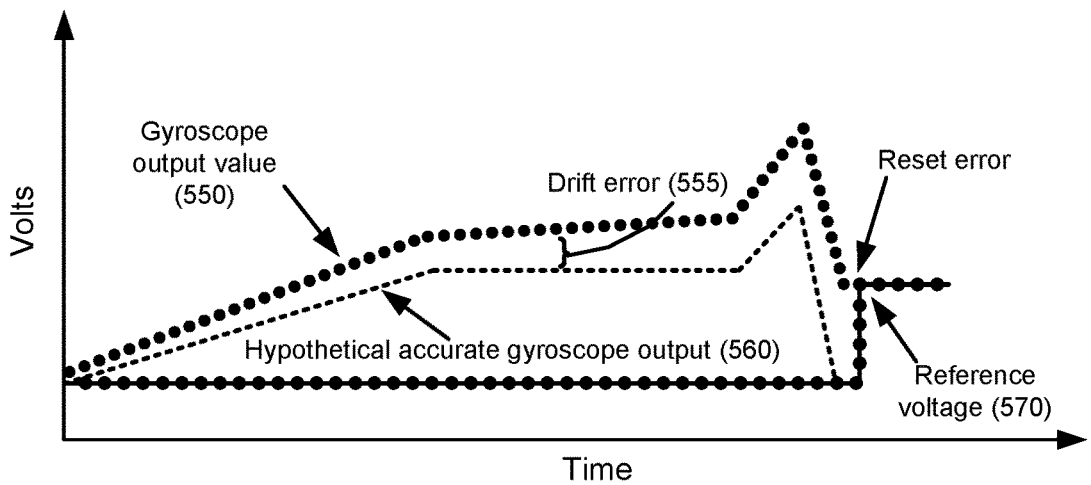
FIG. 5B shows a graph that illustrates the effect of gyroscope drift and compensating for that drift.

FIG. 5B shows a graph that illustrates gyroscope drift and compensating for that drift. The vertical axis shows volts, and the gyroscope output value 550 (large dotted line, at top) shows the voltage that is produced at the output of the gyroscope and that is provided as an input to an integrator. This voltage represents angular velocity of a particular gyroscope component. (This graph represents measurements for a particular gyroscope component, for example the component that measures pitch, and this discussion may be extrapolated to represent what is occurring at the two other component gyroscopes for roll and yaw). As shown by the chart, the gyroscope output value 550 indicates that the angular velocity is increasing for a while, before it roughly levels off as it continues to rotate at an approximately constant velocity, and then it increases in rotational velocity before coming to a somewhat abrupt stop.

The gyroscope output value 550, however, can start to stray from an accurate reading as the temperature of the gyroscope changes. In FIG. 5B, this error is illustrated as error 555 between the gyroscope output value 550 and a hypothetical accurate gyroscope output 560, that represents the gyroscope output as if it were unaffected by temperature.

The gyroscope output 550 is fed into an integrator that accumulates or integrates gyroscope output values over time to determine angular position. The integrator performs the integration by measuring the difference between the gyroscope output value 550 and a reference voltage 570 that is supplied to another input of the integrator. With the gyroscope output voltage drifting away from its purportedly accurate value over time, the error in angular orientation caused by this drift accumulates as the gyroscope output voltage is repeatedly integrated To reset the error, the reference voltage that is supplied to the input of the integrator can be set to the output voltage of the gyroscope when the angular velocity of the IMU or the accelerometer is determined to be zero. Device 100 is configured to operate this way because, when the IMU or accelerometer is measures no rotational motion but the gyroscope shows angular motion, it is apparent that the gyroscope output has drifted. Modifying the reference voltage to correspond to the gyroscope output 550 essentially negates any drift because the integration from that point forward is based on the difference between the reference value 570 and the gyroscope output value 550, and that difference has been reset to 0 volts at a time when the device 100 has been determined through other mechanisms to not be rotating.

In some examples, to change the determined angular orientation of the gyroscope, device 100 can momentarily change the reference voltage to be greater than or less than the gyroscope output value 550 so that the integrated result (e.g., a voltage that represents the angular orientation of the gyroscope) changes one way or another.

Figure 6A:
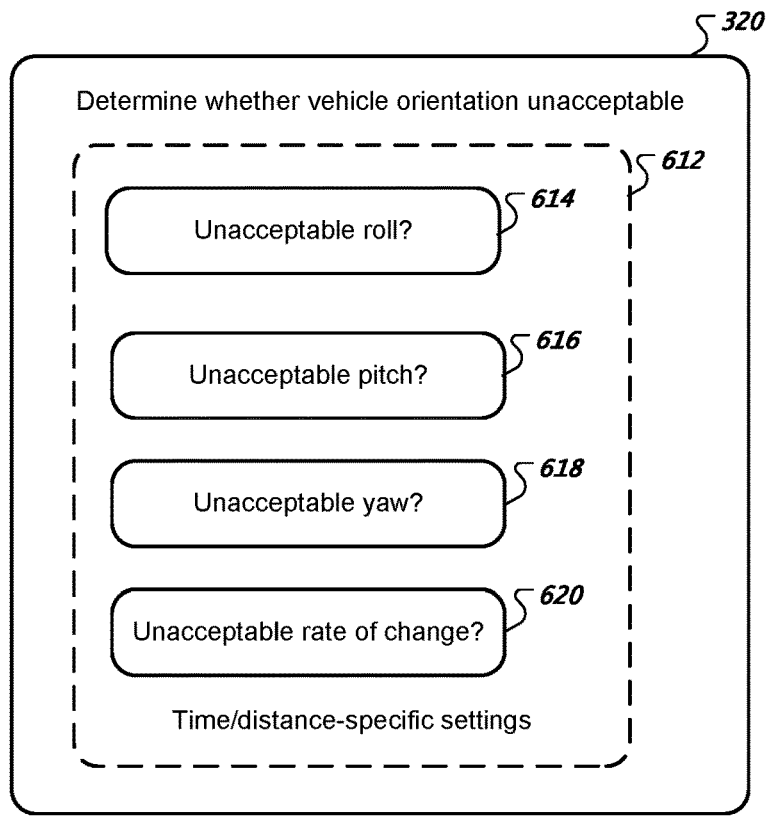
FIG. 6A shows processes for determining whether vehicle orientation is unacceptable.

FIG. 6A shows various processes for determining whether vehicle orientation is unacceptable. As described with respect to FIG. 3, this determination is used by orientation-determining device 100 to determine whether to issue a signal to alert another component of the vehicle to employ one or more safety measures.

At box 320 (see also the same box in FIG. 3), the orientation-determining device 100 determines whether the vehicle orientation is unacceptable. This determination can include performing any one or more of the determinations described with respect to boxes 612, 614, 616, 618, and 620.

At box 614, device 100 determines whether the orientation of the vehicle indicates an unacceptable roll. For example, the device may determine whether the roll exceeds a threshold value, such as 5, 10, or 15 degrees to either side. Such a circumstance may occur when a drag racing vehicle tips to the side onto only two of its four wheels. Since such an occurrence may not be good, the threshold value may be set to a low value. As described with respect to box 302 (FIG. 3), this threshold value (and those described below with respect to other threshold orientations and settings) may be user modifiable.

At box 616, device 100 determines whether the orientation of the vehicle indicates an unacceptable pitch. For example, it may be desirable to allow the front of vehicle to pitch upwards a certain amount, but excessive upwards pitch may be undesirable because the vehicle can go airborne. As such, the device may determine whether the vehicle pitch exceeds a threshold pitch. Similarly, device 100 may determine whether its vehicle orientation has an unacceptable negative pitch, for example, as a result of the vehicle frame breaking and the nose of the vehicle pointing downwards.

At box 618, device 100 may determine whether the orientation of the vehicle indicates an unacceptable yaw. For example, should the vehicle orientation turn a threshold distance to the left or a threshold distance to the right, device 100 would determine that the vehicle's orientation has become unacceptable.

At box 620, device 100 determines whether the rate of change of vehicle orientation is unacceptable. Such a determination can include identifying that the rate of change of the roll, pitch, or yaw has been changing at a threshold rate of change for a determined amount of time. Such a determination can also include identifying that the roll, pitch, or yaw has oscillated longer than a threshold amount of time, even though the vehicle orientation has not yet exceeded a threshold orientation value to the left or right (e.g., because it is oscillating back and forth quickly but with not great enough magnitude).

At box 612, the device can determine whether time or distance-specific settings for any of boxes 614, 616, 618, and 620 have been satisfied. For example, any of the above described thresholds can vary based on the time or distance into a race. For example, device 100 may be configured so that the yaw threshold is relatively modest in the first two seconds of the race (e.g., 20 degrees), but that the yaw threshold is larger thereafter (e.g., 40 degrees). This difference in orientation settings for different portions of the race may exist because if the vehicle starts off turning more than 20 degrees to either side at the beginning of the race, the run may be a poor one even if the vehicle recovers, and the risk of an accident outweighs the opportunity to finish a race that is likely lost. In other examples, different thresholds for roll, pitch, and rate of change apply to different portions of a race, and the thresholds can be lower or higher for the beginning portion of the race than at the later portions of the race.

Figure 6B:
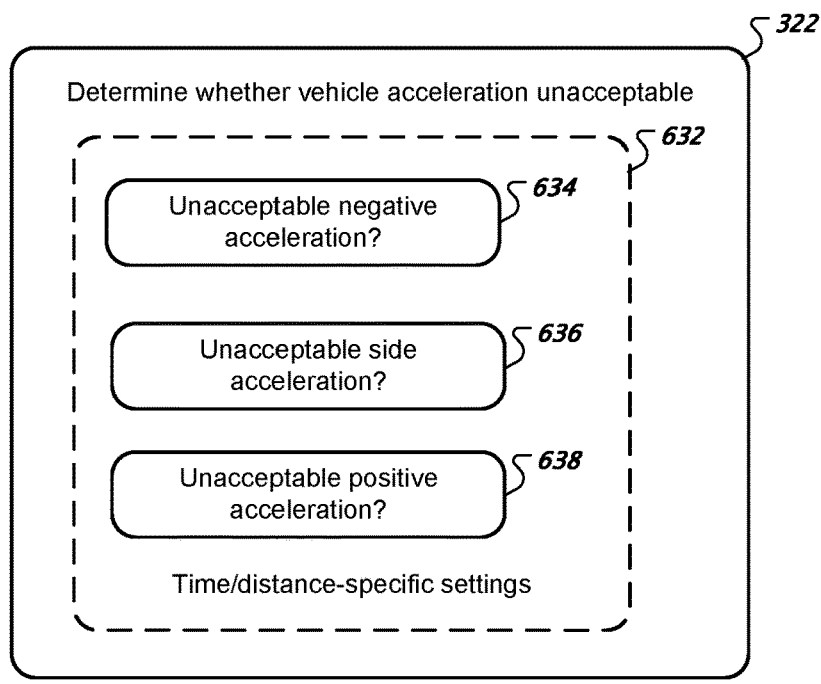
FIG. 6B shows processes for determining whether vehicle acceleration is unacceptable.

FIG. 6B shows processes for determining whether vehicle acceleration is unacceptable. At box 322 (see also the same box in FIG. 3), the orientation-determining device 100 determines whether vehicle acceleration is unacceptable. This determination can include performing any one or more of the determinations described with respect to boxes 632, 634, 636, and 638.

At box 634, device 100 determines whether it has experienced unacceptable negative acceleration. For example, the device can determine whether the negative acceleration exceeds a threshold amount, which could indicate that the vehicle has hit another drag racing vehicle or a stationary object, and has wrecked.

In some implementations, device 100 determines that the vehicle has experienced an unacceptable decrease in acceleration, either with a determination of the above-described negative acceleration or with a determination that the acceleration is positive but that it has decreased from a previous value (e.g., a decrease from 4 g forces to 3 g forces). Such a determination may indicate that the vehicle has lost traction (e.g., that the wheel slip has increased from an acceptable 3% slip to unacceptable 15% slip). A determination that the vehicle is experiencing an unacceptable decrease in acceleration may involve analyzing signals from an accelerometer or from other sensors that measure positive and negative acceleration forces imparted upon the vehicle and any sensors attached thereto, in comparison to sensors that measure a vehicle shaft rate of rotation. A determination that the vehicle is experiencing an unacceptable decrease in acceleration may result from determining that (i) acceleration has decreased but remains positive, (ii) acceleration has decreased and has transitioned from a positive level to a negative level, and/or (iii) acceleration has decreased and transitioned from a positive level to a negative level, and has exceeded a negative threshold value (e.g., such that modest negative acceleration may not trigger action but major negative acceleration may trigger action). Any of these determinations may require that the specified criteria remain satisfied for a determined period of time (e.g., at least 0.1 seconds).

In some examples, device 100 determines that an unacceptable decrease in acceleration has occurred in response to not only determining that acceleration has decreased (e.g., using any of the mechanisms described above), but also a determination that a rate of rotation of a vehicle shaft (e.g., a driveshaft, a crankshaft, or a wheel) has increased concurrent with the decrease in acceleration. A determination that the rate of rotation of a vehicle shaft has increased may occur in response to device 100 determining (i) that the rate of rotation has increased any amount, (ii) that the rate of rotation has experienced increased acceleration, and/or (III) that the rate of rotation has exceeded a threshold level over a target run curve. Any of these determinations may require that the specified criteria remain satisfied for a determined period of time (e.g., at least 0.1 seconds). The target run curve may represent target rates of rotation for corresponding times during a vehicle race, and may have been generated based on rates of rotation recorded for one or more previous vehicle races. The device 100 may compare a current rate of rotation of a rotating vehicle shaft to corresponding rates of rotation in the target run curve for corresponding times during a race to determine whether to take actions to increase or decrease a speed of the vehicle so that the rate of rotation trends towards the run curve. The comparison between the current crate of rotation and the target rate of rotation may begin as a result of receiving a trigger signal that indicates that the race has started (e.g., a signal that the transmission brake has been released).

Combined, a determination that an unacceptable decrease in acceleration has occurred and that the rate of the rotation of a vehicle shaft has increased a determined level may indicate both that the vehicle has begun to slow and that the rate of rotation of one or more wheels has increased, and therefore that the vehicle may have lost traction. When traction has not been lost (e.g., because any wheel slip remains at acceptable or even desirable levels), the acceleration forces measured by a force sensor (e.g., an accelerometer or g-force meter) and the acceleration of a rotating vehicle shaft may remain roughly proportional to each other. As one of these measurements increases, the other increases a proportional amount or with modest variance thereto. As one decreases, the other decreases a proportional amount or with modest variance thereto. As such, the above-described process for identifying that traction has been lost may include comparing differences between acceleration forces measured using a force sensor and the acceleration of a rotating vehicle shaft, and determining whether a proportion between such values changes more than a threshold amount over a given period of time.

Figure 7:
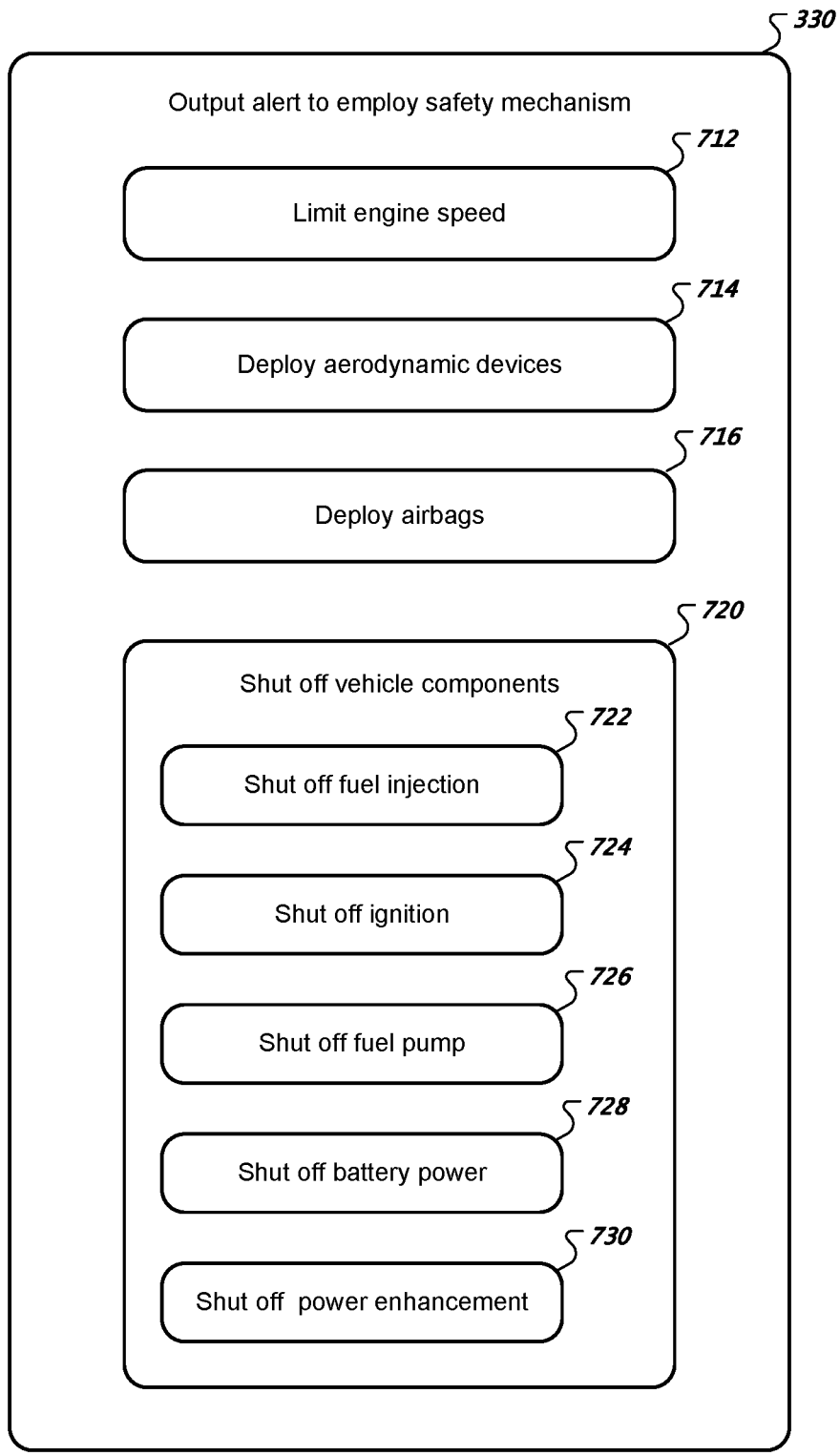
FIG. 7 shows processes for outputting an alert to employ a safety mechanism.

Given a determination that the vehicle may have lost traction (e.g., that wheel slip has reached an unacceptable level), device 100 may perform various actions to slow the spinning of the vehicle wheels, for example, by performing various of the actions described with respect to FIG. 7. These actions are described in greater detail later in this disclosure, but example actions may include limiting engine speed (box 712) (e.g., by retarding ignition timing) or shutting off vehicle components (box 720). In some examples, device 100 may perform such an action to slow spinning of vehicle wheels until determining that wheel slip is within an acceptable range, for example, upon determining that the acceleration forces and vehicle rotation shaft acceleration are both positive and/or that the proportion between the two values has returned to a typical proportion value.

At box 636, device 100 determines whether it has experienced unacceptable side acceleration. For example, the device can determine whether the acceleration to either side exceeds a threshold amount, which could indicate that the vehicle has been hit or has hit another vehicle, or that the vehicle has glanced off of a side wall.

At box 638, device 100 determines whether it has experienced unacceptable positive acceleration. For example, the device can determine whether the positive acceleration exceeds a threshold amount, which could indicate that the vehicle has been hit from behind by another vehicle.

At box 632, the computing device determines whether time or distance-specific settings for any of boxes 634, 636, or 638 have been satisfied. For example, any of the above-described thresholds for boxes 634, 636, and 638 can vary based on the time into a race or a distance into the race. An example illustration regarding different acceleration thresholds for different portions in a race, includes the device 100 being configured to account for vehicle shaking that commonly occur in the first second or two of a race. As such, the acceleration threshold for this portion of a race may be higher, and after this time period has passed, the threshold may be lower so that the vehicle will determine that vehicle acceleration is unacceptable upon receiving lower acceleration measurements.

Figure 6C:
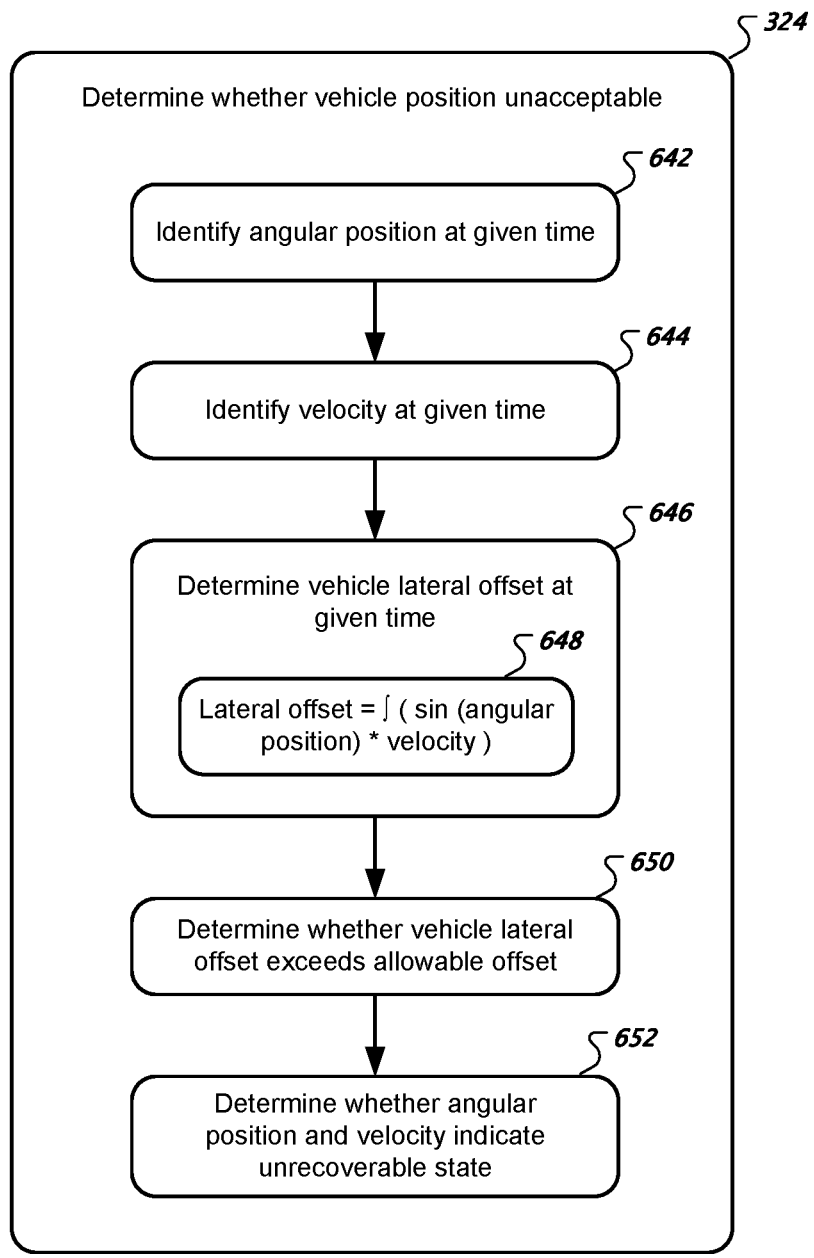
FIG. 6C shows processes for determining whether vehicle position is unacceptable.

FIG. 6c shows processes for determining whether vehicle position is unacceptable. At box 324 (see also the same box in FIG. 3), the orientation-determining device 100 determines whether the vehicle position is unacceptable.

At box 644, device 100 identifies the angular position at a given time. An example angular position calculation follows: $\theta(t)=\int w(t)\, dt$, assuming that the angular position is set to zero at the time of launch, with $w(t)$=angular velocity as a function of time, and $\theta(t)$=angular position as a function of time. In this example, the angular position may be the angular orientation value that is output as a result of the operations performed with respect to FIG. 4.

At box 644, device 100 may identify the velocity. An example velocity calculation follows: $v(t)=\int a(t)\, dt$, assuming that velocity is zero when time is zero, where $a(t)$=acceleration as a function of time, and $v(t)$=velocity as a function of time.

At box 646, device 100 may determine the lateral offset of the vehicle at a given time. An example lateral offset calculation follows (see box 648): $o(t)=\int(\sin(\theta(t))*v(t))\, dt$, where $o(t)$=offset from center as a function of time.

At box 660, device 100 determines whether the lateral offset of the vehicle exceeds an allowable offset. For example, the device may determine whether the vehicle lateral offset determined at box 646 exceeds a positive or negative threshold distance from center, which indicates that the vehicle has strayed from the center of the track and may be in danger of hitting another vehicle or the wall. This distance from center track may vary based on time or distance into the race.

At box 662, device 100 determines whether the angular position and the velocity indicate that the vehicle is in an unrecoverable state. For example, even though the vehicle may not have reached a threshold lateral offset (e.g., 5 meters from center of track), should the vehicle be travelling fast enough and at a sharp enough angle that the vehicle will inevitably reach that threshold or one beyond it, the vehicle may determine that its position is unacceptable under the given conditions.

In some examples, device 100 measures the distance a vehicle has travelled down the track, and if the vehicle is determined to have travelled a certain distance and is still travelling at a threshold velocity, device 100 may send a signal to deploy a safety mechanism. This determination may be performed to ensure that vehicles stop at the end of the race track, for example, by deploying a parachute, and do not continue at a high speed toward a wall or other type of end of the race track.

FIG. 7 shows processes for employing a safety mechanism. Performing the actions of box 330 (see the same box in FIG. 3) may include performing the actions of any one or more of boxes 712, 714, 716, 718, and 720.

At box 712, device 100 outputs an alert to limit engine speed. For example, should the device determine that the vehicle has reached an unacceptable condition that has likely led to the vehicle losing the race, the device may cause the vehicle to slow down to a lower speed so that the vehicle does not end up in a catastrophic situation, but so that the vehicle is able to finish the race at a slower speed. In those examples in which the device is used to fine tune performance of the vehicle during the race, the device can cause the vehicle to limit the engine speed for a short period of time, should the vehicle be accelerating faster than a predefined target acceleration curve, to ensure that optimal traction is maintained.

At box 714, device 100 outputs an alert to deploy an aerodynamic device. The aerodynamic device can include a parachute, a safety flap, or both.

At box 716, device 100 outputs an alert to deploy one or more airbags.

At box 720, device 100 outputs an alert to shut off one or more vehicle components. Doing so can ensure that the engine or other vehicle components do not continue to operate after the vehicle has experienced a catastrophic event, such as an accident with another vehicle or the vehicle going airborne. Vehicle components that can be shut off include the fuel injection (box 722), the ignition (box 724), the fuel pump (box 726), battery power (box 728), and any power enhancement such as nitrous oxide (box 730).

In some examples, which actions are performed is dependent on the state of the vehicle. For example, a determination that the vehicle has achieved an unacceptable orientation may lead the device to limit the engine speed. On the other hand, should the vehicle experience significant negative acceleration, the vehicle may have hit a wall and simply limiting the engine speed may not be a drastic-enough action. Parachute deployment may be associated with the negative acceleration event. In this way, different events can be associated with different types of signals to cause the deployment of different types of safety devices.

In some implementations, device 100 includes multiple sensors of one or more particular type, and can average, otherwise combine the readings from each of the sensors, or select one or more of the sensors from which to discard measurements. For example, device 100 may include two accelerometers from two different manufacturers. The accelerometers may be mounted to the circuit board at different orientations (e.g., with one orientated horizontally at a 45 degree angle with respect to the other, so that one accelerometer's forward orientation is a combination of forward and sideways for the other accelerometer). This configuration can ensure that any acceleration (at least in the horizontal direction) would involve measurements from at least three component accelerometers (at least one component accelerometer from a first accelerometer, and at least two component accelerometers from a second accelerometer). Such a configuration and use of multiple sensors can increase the amount of MEMS internal components used to measure a force in a particular direction from one to at least three. As such the forward acceleration from a first device (oriented normally) could be averaged with the "forward" acceleration from a second device (oriented at an angle, such that the "forward" acceleration for this second device is a combination of the forward and sideways acceleration forces).

Should device 100 determine that the acceleration forces calculated for each of the two accelerometers not correspond to each other, the device may issue an indication that the accelerometer or the device 100 as a whole is not producing accurate measurements. This indication may cause the device to not calibrate the gyroscope based on the accelerometer data (e.g., so that the gyroscope is only calculated using the IMU), or may cause the device to send an error indication that the device should be serviced before further use. The orientation-determining device may also or alternatively include two or more gyroscopes and/or two or more IMUs, in the same manner that the device may include two or more accelerometers.

In some implementations, the orientation-determining device 100 does not perform all of the operations described in this document. Rather, the orientation-determining device may include the sensors mounted in the device 100, but the raw sensor data, or the orientation, velocity, acceleration, position data that is derived therefrom, may be transferred to an external device that separately determines whether to employ any safety mechanisms. In other words, rather than the orientation-determining device 100 being a self-contained unit that outputs a simple signal that indicates that something has gone wrong and that the vehicle needs to immediately employ one or more safety mechanisms, the orientation-determining device 100 can simply output the vehicle state data, and another device can determine whether to employ a safety mechanism. In some examples, the orientation-determining device 100 may simply include the sensors described herein, and another device may generate the state data therefrom, for example, so that other device may determine the lateral offset of the vehicle and may perform some or all of the operations described with respect to FIG. 4.

In various implementations, operations that are performed "in response to" or "as a consequence of" another operation (e.g., a determination or an identification) are not performed if the prior operation is unsuccessful (e.g., if the determination was not performed). Operations that are performed "automatically" are operations that are performed without user intervention (e.g., intervening user input). Features in this document that are described with conditional language may describe implementations that are optional. In some examples, "transmitting" from a first device to a second device includes the first device placing data into a network for receipt by the second device, but may not include the second device receiving the data. Conversely, "receiving" from a first device may include receiving the data from a network, but may not include the first device transmitting the data.

"Determining" by a computing system can include the computing system requesting that another device perform the determination and supply the results to the computing system. Moreover, "displaying" or "presenting" by a computing system can include the computing system sending data for causing another device to display or present the referenced information.

Figure 8A:
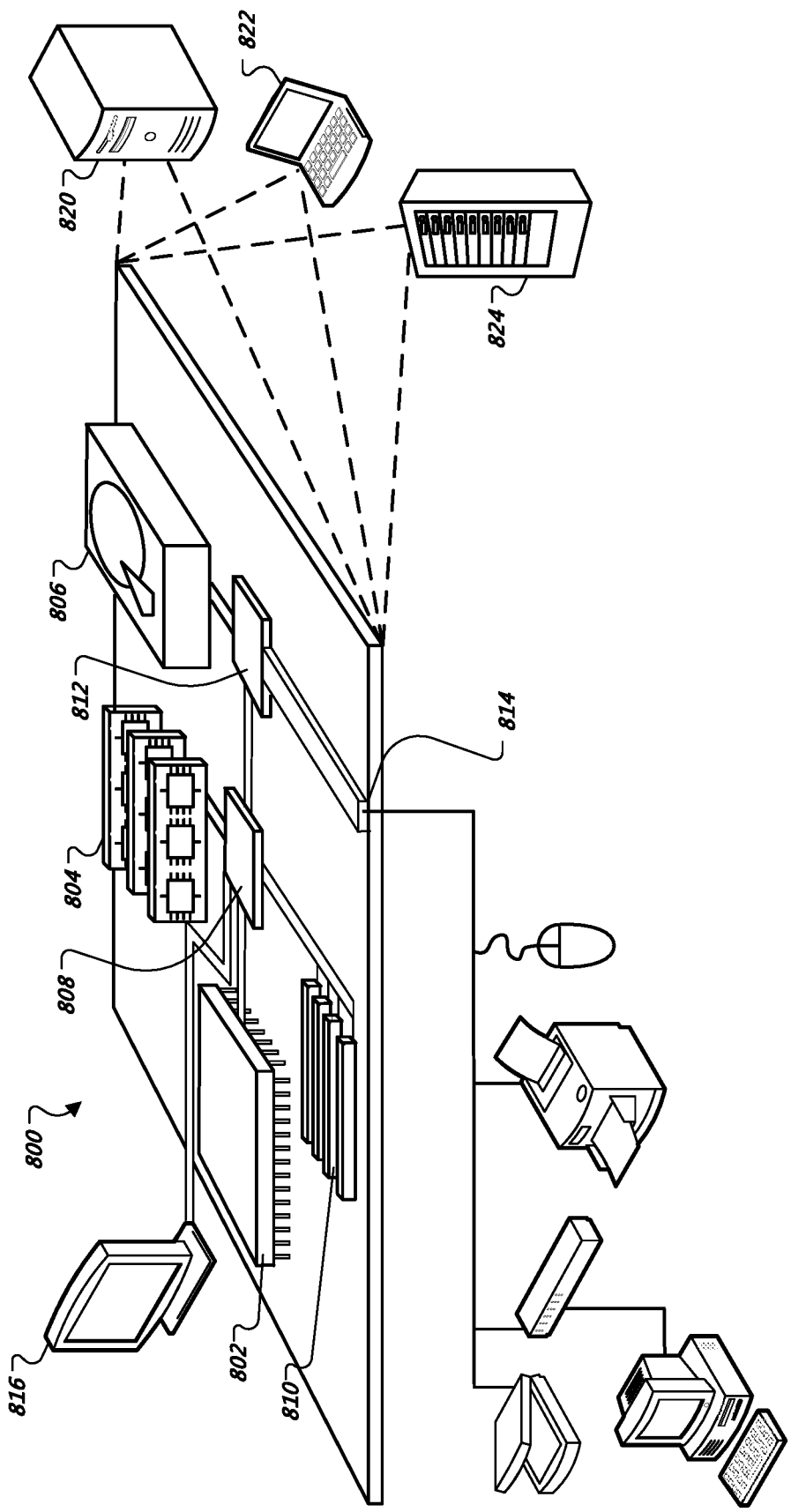
FIGS. 8A-8B show block diagrams of computing devices that may be used to implement the systems and methods described in this document, as either a client or as a server or plurality of servers.
Figure 8B:
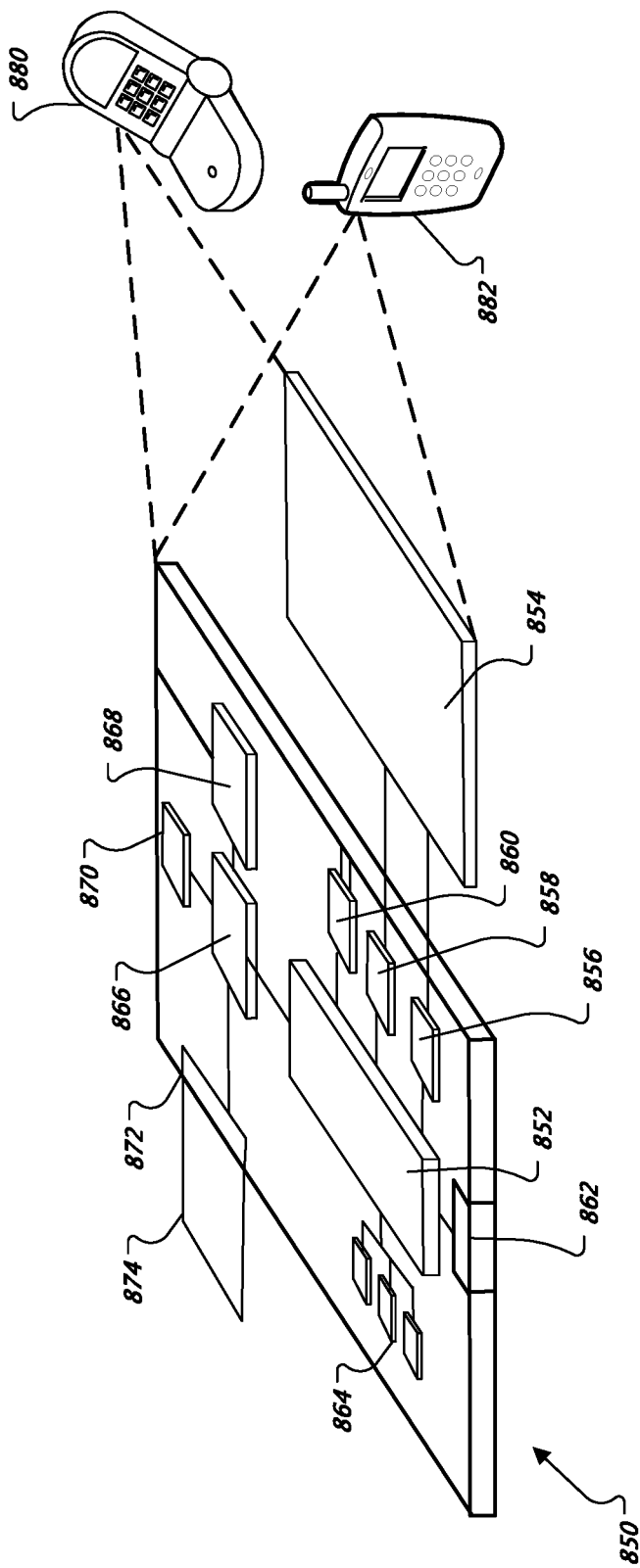

FIGS. 8A-B show block diagrams of computing devices 800, 850 that may be used to implement the systems and methods described in this document, as either a client or as a server or plurality of servers. Computing device 800 is intended to represent various forms of digital computers, such as laptops, desktops, workstations, personal digital assistants, servers, blade servers, mainframes, and other appropriate computers. Computing device 850 is intended to represent various forms of mobile devices, such as personal digital assistants, cellular telephones, smartphones, and other similar computing devices. The components shown here, their connections and relationships, and their functions, are meant to be examples only, and are not meant to limit implementations described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high-speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 804, the storage device 806, or memory on processor 802.

The high-speed controller 808 manages bandwidth-intensive operations for the computing device 800, while the low speed controller 812 manages lower bandwidth-intensive operations. Such allocation of functions is an example only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 850. Each of such devices may contain one or more of computing device 800, 850, and an entire system may be made up of multiple computing devices 800, 850 communicating with each other.

Computing device 850 includes a processor 852, memory 864, an input/output device such as a display 854, a communication interface 866, and a transceiver 868, among other components. The device 850 may also be provided with a storage device, such as a microdrive or other device, to provide additional storage. Each of the components 850, 852, 864, 854, 866, and 868, are interconnected using various buses, and several of the components may be mounted on a common motherboard or in other manners as appropriate.

The processor 852 can execute instructions within the computing device 850, including instructions stored in the memory 864. The processor may be implemented as a chipset of chips that include separate and multiple analog and digital processors. Additionally, the processor may be implemented using any of a number of architectures. For example, the processor may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 850, such as control of user interfaces, applications run by device 850, and wireless communication by device 850.

Processor 852 may communicate with a user through control interface 858 and display interface 856 coupled to a display 854. The display 854 may be, for example, a TFT (Thin-Film-Transistor Liquid Crystal Display) display or an OLED (Organic Light Emitting Diode) display, or other appropriate display technology. The display interface 856 may comprise appropriate circuitry for driving the display 854 to present graphical and other information to a user. The control interface 858 may receive commands from a user and convert them for submission to the processor 852. In addition, an external interface 862 may be provide in communication with processor 852, so as to enable near area communication of device 850 with other devices. External interface 862 may provided, for example, for wired communication in some implementations, or for wireless communication in other implementations, and multiple interfaces may also be used.

The memory 864 stores information within the computing device 850. The memory 864 can be implemented as one or more of a computer-readable medium or media, a volatile memory unit or units, or a non-volatile memory unit or units. Expansion memory 874 may also be provided and connected to device 850 through expansion interface 872, which may include, for example, a SIMM (Single In Line Memory Module) card interface. Such expansion memory 874 may provide extra storage space for device 850, or may also store applications or other information for device 850. Specifically, expansion memory 874 may include instructions to carry out or supplement the processes described above, and may include secure information also. Thus, for example, expansion memory 874 may be provided as a security module for device 850, and may be programmed with instructions that permit secure use of device 850. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 874, or memory on processor 852 that may be received, for example, over transceiver 868 or external interface 862.

Device 850 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 870 may provide additional navigation- and location-related wireless data to device 850, which may be used as appropriate by applications running on device 850.

Device 850 may also communicate audibly using audio codec 860, which may receive spoken information from a user and convert it to usable digital information. Audio codec 860 may likewise generate audible sound for a user, such as through a speaker, e.g., in a handset of device 850.

Such sound may include sound from voice telephone calls, may include recorded sound (e.g., voice messages, music files, etc.) and may also include sound generated by applications operating on device 850.

The computing device 850 may be implemented in a number of different forms, as shown in the figure. For example, it may be implemented as a cellular telephone 880. It may also be implemented as part of a smartphone 882, personal digital assistant, or other similar mobile device.

Additionally computing device 800 or 850 can include Universal Serial Bus (USB) flash drives. The USB flash drives may store operating systems and other applications. The USB flash drives can include input/output components, such as a wireless transmitter or USB connector that may be inserted into a USB port of another computing device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for performing the systems and methods described in this document may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. An orientation-determining device to determine an orientation of a vehicle, comprising:
   a housing;
   an accelerometer positioned within the housing;
   a gyroscope positioned within the housing;
   an electrical input terminal adapted to connect with an externally-located conductor located externally to the housing of the orientation-determining device; and
   one or more processors positioned within the housing and configured, through interaction with one or more computer-readable media, to:
      determine the orientation of the vehicle through analysis of measurements generated by the accelerometer and the gyroscope, and
      set the orientation of the vehicle to a default orientation upon receipt of an electrical signal that is received through the electrical input terminal from an external system and that indicates that a brake of the vehicle has been released or is about to be released.

2. The orientation-determining device of claim 1, wherein the one or more processors are configured, through interaction with the one or more computer-readable media, to:
   determine a velocity of the vehicle through analysis of measurements generated by the accelerometer;
   determine a lateral offset of the vehicle from a central orientation of travel based on analysis of the orientation of the vehicle and the velocity of the vehicle.

3. The orientation-determining device of claim 1, further comprising a signal output terminal adapted to connect with an externally-located conductor located externally to the housing of the orientation-determining device, wherein the one or more processors are configured, through interaction with the one or more computer-readable media, to:
   (i) determine whether the orientation of the vehicle determined by the one or more processors satisfies criterion for activating an emergency safety measure, and
   (ii) provide an electrical signal to the signal output terminal as an indication to activate the emergency safety measure, responsive to having determined that the orientation of the vehicle satisfies the criterion for activating the emergency safety measure.

4. The orientation-determining device of claim 1, wherein the electrical signal received through the electrical input terminal activates a device external to the orientation-determining device in addition to setting the orientation of the vehicle to the default orientation.

5. The orientation-determining device of claim 1, wherein the electrical signal received through the electrical input terminal indicates that the vehicle has begun a race or is about to begin a race.

6. The orientation-determining device of claim 1, further comprising:
a circuit board to which one or more of the accelerometer, the gyroscope, and the one or more processors are attached;
a first gasket between a first side of the circuit board and the housing; and
a second gasket between a second side of the circuit board and the housing, the second side of the circuit board opposing the first side of the circuit board.

7. The orientation-determining device of claim 6, further comprising a non-conductive fluid that is:
disposed in a first cavity that is formed between the first side of the circuit board and the housing;
contained within the first cavity by the first gasket;
disposed in a second cavity that is formed between the second side of the circuit board and the housing; and
contained within the second cavity by the second gasket.

8. An orientation-determining device to determine an orientation of a vehicle, comprising:
a housing;
an accelerometer positioned within the housing;
a gyroscope positioned within the housing;
one or more processors positioned within the housing and configured, through interaction with one or more computer-readable media, to determine the orientation of the vehicle through analysis of measurements generated by the accelerometer and the gyroscope;
a circuit board to which one or more of the accelerometer, the gyroscope, and the one or more processors are attached, wherein:
the housing surrounds a first side of the circuit board to form a first cavity between the first side of the circuit board and the housing,
the housing surrounds a second side of the circuit board to form a second cavity between the second side of the circuit board and the housing, and
the first side of the circuit board opposes the second side of the circuit board; and
a non-conductive fluid disposed in the first cavity and the second cavity.

9. The orientation-determining device of claim 8, wherein the circuit board defines an opening through which the non-conductive fluid is able to flow between the first cavity and the second cavity.

10. The orientation-determining device of claim 8, wherein the housing includes a port that is adapted to permit introduction of the non-conductive fluid into the first cavity from an exterior of the housing.

11. An orientation-determining device to determine an orientation of a vehicle, comprising:
a housing;
an accelerometer positioned within the housing;
a gyroscope positioned within the housing;
a signal output terminal adapted to connect with an externally-located conductor located externally to the housing of the orientation-determining device;
one or more processors positioned within the housing and configured, through interaction with one or more computer-readable media, to:
determine the orientation of the vehicle through analysis of measurements generated by the accelerometer and the gyroscope;
determine whether the orientation of the vehicle determined by the one or more processors satisfies criterion for activating an emergency safety measure, and
provide an electrical signal to the signal output terminal as an indication to activate the emergency safety measure, responsive to having determined that the orientation of the vehicle satisfies the criterion for activating the emergency safety measure, wherein the emergency safety measure includes deploying a parachute from the vehicle, and wherein the signal output terminal is electrically connected via the externally-located conductor to an external system that is configured to cause deployment of the parachute upon the electrical signal being provided to the signal output terminal.

12. An orientation-determining device to determine an orientation of a vehicle, comprising:
a housing;
an accelerometer positioned within the housing;
a gyroscope positioned within the housing; and
one or more processors positioned within the housing and configured, through interaction with one or more computer-readable media, to:
determine the orientation of the vehicle through analysis of measurements generated by the accelerometer and the gyroscope;
determine a velocity of the vehicle through analysis of measurements generated by the accelerometer;
determine a lateral offset of the vehicle from a central orientation of travel based on analysis of the orientation of the vehicle and the velocity of the vehicle;
determine that the lateral offset of the vehicle exceeds a lateral offset threshold of the vehicle; and
provide an electrical signal as an indication to activate an emergency safety measure, responsive to having determined that the lateral offset of the vehicle exceeds the lateral offset threshold of the vehicle.

13. A computer-implemented method for determining an orientation of a vehicle, the method comprising:
receiving, by one or more processors positioned within a housing of an orientation-determining device, first measurements from an accelerometer positioned within the housing of the orientation-determining device;
receiving, by the one or more processors positioned within the housing of the orientation-determining device, second measurements from a gyroscope positioned within the housing of the orientation-determining device;
determining, by the one or more processors positioned within the housing of the orientation-determining device, the orientation of the vehicle through analysis of the first measurements received from the accelerometer and the second measurements received from the gyroscope; and
setting, by the one or more processors positioned within the housing of the orientation-determining device, the orientation of the vehicle to a default orientation upon receipt of an electrical signal that is received from an external system and that indicates that a brake of the vehicle has been released or is about to be released.

14. A computer-implemented method, comprising:
receiving, by one or more processors positioned within a housing of an orientation-determining device, first measurements from an accelerometer positioned within the housing of the orientation-determining device;
receiving, by the one or more processors positioned within the housing of the orientation-determining device, second measurements from a gyroscope positioned within the housing of the orientation-determining device;

determining, by the one or more processors positioned within the housing of the orientation-determining device, an orientation of a vehicle through analysis of the first measurements received from the accelerometer and the second measurements received from the gyroscope;

determining, by the one or more processors positioned within the housing of the orientation-determining device, whether the orientation of the vehicle determined by the one or more processors satisfies criterion for activating an emergency safety measure; and providing an electrical signal to an external system as an indication to activate the emergency safety measure, responsive to having determined that the orientation of the vehicle satisfies the criterion for activating the emergency safety measure, wherein the emergency safety measure includes deploying a parachute from the vehicle and the signal causes deployment of the parachute upon the electrical signal being provided to the external system.

15. A computer-implemented method, comprising:

receiving, by one or more processors positioned within a housing of an orientation-determining device, first measurements from an accelerometer positioned within the housing of the orientation-determining device;

receiving, by the one or more processors positioned within the housing of the orientation-determining device, second measurements from a gyroscope positioned within the housing of the orientation-determining device;

determining, by the one or more processors positioned within the housing of the orientation-determining device, an orientation of a vehicle through analysis of the first measurements received from the accelerometer and the second measurements received from the gyroscope;

determining, by the one or more processors positioned within the housing of the orientation-determining device, a velocity of the vehicle through analysis of measurements generated by the accelerometer;

determining, by the one or more processors positioned within the housing of the orientation-determining device, a lateral offset of the vehicle from a central orientation of travel based on analysis of the orientation of the vehicle and the velocity of the vehicle;

determining, by the one or more processors positioned within the housing of the orientation-determining device, that the lateral offset of the vehicle exceeds a lateral offset threshold of the vehicle; and providing an electrical signal as an indication to activate an emergency safety measure, responsive to having determined that the lateral offset of the vehicle exceeds the lateral offset threshold of the vehicle.

16. The orientation-determining device of claim 3, wherein:

the emergency safety measure includes limiting a speed of a vehicle engine of the vehicle or shutting down the vehicle engine; and the signal output terminal is electrically connected via the externally-located conductor to an external system that is configured to limit the speed of the vehicle engine or shut down the vehicle engine upon the electrical signal being provided to the signal output terminal.

* * * * *